(12) United States Patent
Knapp et al.

(10) Patent No.: US 12,732,158 B2
(45) Date of Patent: Sep. 8, 2026

(54) GEOMETRIC PROPERTIES OF AN EMBEDDED ELECTRODE STRUCTURE FOR AN ACOUSTIC FILTER

(71) Applicant: RF360 Singapore Pte. Ltd., Republic Plaza (SG)

(72) Inventors: Matthias Knapp, Munich (DE); Johannes Koerber, Munich (DE); Matthias Honal, Munich (DE)

(73) Assignee: RF360 Singapore Pte. Ltd., Singapore (SG)

( * ) Notice: Subject to any disclaimer, the term of this patent is extended or adjusted under 35 U.S.C. 154(b) by 97 days.

(21) Appl. No.: 18/611,282

(22) Filed: Mar. 20, 2024

(65) Prior Publication Data

US 2025/0300625 A1 Sep. 25, 2025

(51) Int. Cl.
*H03H 9/145* (2006.01)
*H03H 9/02* (2006.01)

(52) U.S. Cl.
CPC .... *H03H 9/14544* (2013.01); *H03H 9/02834* (2013.01); *H03H 9/14541* (2013.01)

(58) Field of Classification Search
CPC ........... H03H 9/14544; H03H 9/02834; H03H 9/14541; H03H 9/25; H03H 9/02574;
(Continued)

(56) References Cited

U.S. PATENT DOCUMENTS 8,169,121 B2 * 5/2012 Kimura .............. H03H 9/14541 310/313 R
8,183,737 B2 * 5/2012 Kimura ................ H03H 9/0222 310/313 R (Continued)

FOREIGN PATENT DOCUMENTS

CN 112653409 A 4/2021
WO 2023234383 A1 12/2023

OTHER PUBLICATIONS

Kadota, et al., "SiO2/grooved Al-Electrodes/LiTaO3 Structures having large Coefficient, large Coupling Factor, and excellent Temperature Characteristics even with thick AI electrode", May 2006, 5 pages.

(Continued)

*Primary Examiner* — John W Poos
(74) *Attorney, Agent, or Firm* — Polsinelli

(57) ABSTRACT

An apparatus is disclosed for implementing an acoustic filter having an embedded electrode structure with particular geometric properties. In an example aspect, the geometric properties of the embedded electrode structure can be tailored to enhance performance of the acoustic filter in terms of insertion loss, temperature stability, quality factor, and spurious-mode suppression. Furthermore, the geometric properties can enable the acoustic filter to be tuned for a particular frequency range and/or bandwidth, to fit within space-constrained devices, and improve the ease of manufacturing. Various performance improvements and design requirements can be met using the embedded electrode structure because the geometric properties of the embedded electrode structure provide additional degrees of freedom in designing the acoustic filter. This design freedom enables a performance of the acoustic filter to be optimized in the presence of multiple complex interdependencies.

15 Claims, 16 Drawing Sheets

(58) Field of Classification Search
CPC ............... H03H 9/145; H03H 9/02228; H03H 2009/02165; H03H 9/02031; H03H 9/02015; H03H 9/02559; H03H 9/132; H03H 9/14538; H03H 9/64; H03H 9/176; H03H 3/02; H03H 3/08; H03H 9/02614; H03H 9/02976; H03H 9/02102; H03H 9/175; H03H 9/173; H03H 9/02062; H03H 9/02157; H03H 9/02992; H03H 9/564; H03H 9/0207; H03H 9/02149; H03H 9/6483; H03H 9/171; H03H 9/205; H03H 9/568; H03H 9/02818; H03H 9/02858; H03H 9/0542; H03H 9/059; H03H 9/1064; H03H 9/14561; H03H 9/174; H03H 9/02086; H03H 9/02661; H03H 9/02881; H03H 9/131; H03H 9/14502; H03H 9/14594; H03H 9/562; H03H 9/6406; H03H 2003/023; H03H 2009/02196; H03H 9/02023; H03H 9/02125; H03H 9/0222; H03H 9/02543; H03H 9/02952; H03H 9/13; H03H 9/14508; H03H 9/1457; H03H 9/46; H03H 9/566; H03H 9/581; H03H 9/584; H03H 9/587; H03H 9/605; H03H 9/6403; H03H 9/725; H03H 2003/021; H03H 7/01; H03H 9/02133; H03H 9/02551; H03H 9/02669; H03H 9/02866; H03H 9/0514; H03H 9/1035; H03H 9/1042; H03H 9/1452; H03H 9/14532; H03H 9/14547; H03H 9/1455; H03H 9/14564; H03H 9/6453

See application file for complete search history.

(56) References Cited

U.S. PATENT DOCUMENTS

| | | | | |
|---|---|---|---|---|
| 8,680,744 | B2 | 3/2014 | Kimura et al. | |
| 2007/0120439 | A1* | 5/2007 | Kadota | H03H 9/14541 310/313 R |
| 2012/0133246 | A1* | 5/2012 | Yaoi | H03H 9/131 310/313 C |
| 2022/0200566 | A1 | 6/2022 | Kadota et al. | |
| 2022/0337220 | A1* | 10/2022 | Ballandras | H03H 9/02031 |

OTHER PUBLICATIONS

Kadota M., et al., "Ultra-Wideband SAW Resonator Composed of Grooved Cu Electrodes and Its Application to Tunable Filters", Electronics and Communications in Japan, Scripta Technica, New York, US, vol. 96, No. 2, Feb. 28, 2013, XP001580989, pp. 32-40, figure 1.

Partial International Search Report—PCT/SG2025/050107—ISA/EPO—Jun. 6, 2025.

International Search Report and Written Opinion PCT/SG2025/050107 ISA/EPO Sep. 17, 2025.

* cited by examiner

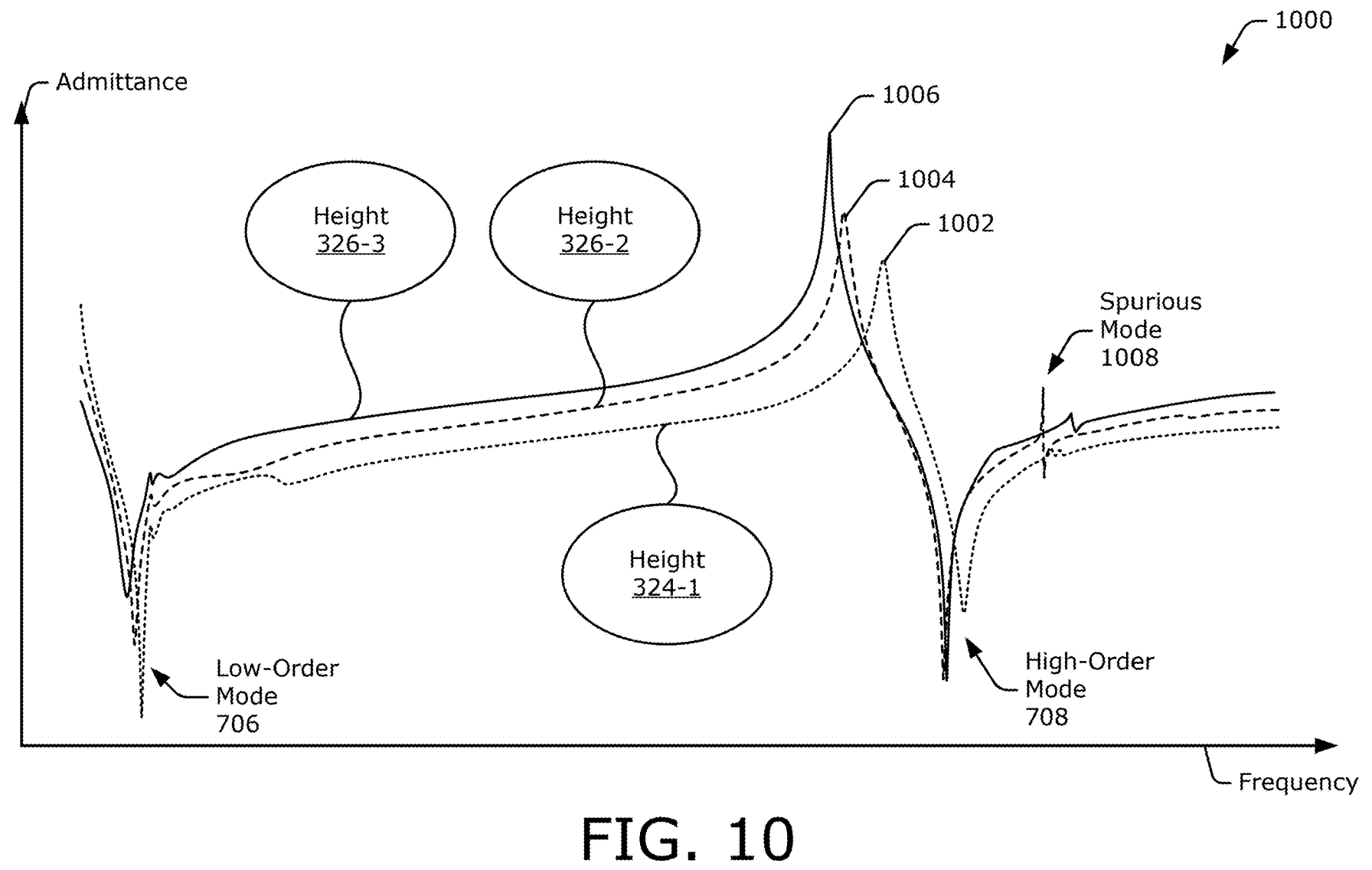

Frequency

Admittance

Spurious Mode 1008

High-Order Mode 708

Low-Order Mode 706

1002

1004

1006

Height 324-1

Height 326-2

Height 326-3

FIG. 10

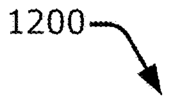

1202

Provide a piezoelectric layer having two opposite surfaces that respectively form a first plane and a second plane

1204

Provide an electrode structure that is at least partially embedded within the piezoelectric layer, the electrode structure comprising multiple fingers positioned across a first axis, wherein a value of a metallization ratio associated with the multiple fingers is greater than approximately 0.2, a cross section of each finger of the multiple fingers has a planar surface that is perpendicular to the first plane, the cross section having a first segment that abuts the first plane and a second segment that is between the first plane and the second plane, a tangent line positioned at a point along an edge of the cross section forms an exterior angle relative to the first axis, a value of the exterior angle having a range approximately from 50° to 120°, the edge of the cross section joining the first segment to the second segment

FIG. 12

GEOMETRIC PROPERTIES OF AN EMBEDDED ELECTRODE STRUCTURE FOR AN ACOUSTIC FILTER

TECHNICAL FIELD

This disclosure relates generally to wireless transceivers and other components that employ filters and, more specifically, to an acoustic filter having an embedded electrode structure with particular geometric properties.

BACKGROUND

Electronic devices use radio-frequency (RF) signals to communicate information. These radio-frequency signals enable users to talk with friends, download information, share pictures, remotely control household devices, and receive global positioning information. To transmit or receive the radio-frequency signals within a given frequency band, the electronic device may use filters to pass signals within the frequency band and to suppress (e.g., attenuate) jammers or noise having frequencies outside of the frequency band. It can be challenging, however, to optimize a filter that provides filtering for radio-frequency applications. In particular, the interdependency between various design parameters can make it challenging to realize a filter with a particular frequency response and bandwidth while meeting size constraints to fit within space-constrained devices.

SUMMARY

An apparatus is disclosed that implements an acoustic filter having an embedded electrode structure with particular geometric properties. In an example aspect, the geometric properties of the embedded electrode structure can be tailored to enhance performance of the acoustic filter in terms of insertion loss, temperature stability, quality factor, and spurious-mode suppression. Furthermore, the geometric properties can enable the acoustic filter to be tuned for a particular frequency range and/or bandwidth, to fit within space-constrained devices, and improve the ease of manufacturing. Various performance improvements and design requirements can be met using the embedded electrode structure because the geometric properties of the embedded electrode structure provide additional degrees of freedom in designing the acoustic filter. This design freedom enables a performance of the acoustic filter to be optimized in the presence of multiple complex interdependencies.

In an example aspect, an apparatus for filtering is disclosed. The apparatus includes an acoustic filter with a piezoelectric layer and an electrode structure. The piezoelectric layer has two opposite surface that respectively form a first plane and a second plane. The electrode structure is at least partially embedded within the piezoelectric layer. The electrode structure includes multiple fingers positioned across a first axis. A value of a metallization ratio associated with the multiple fingers is greater than approximately 0.2. A cross section of each finger of the multiple fingers has a planar surface that is perpendicular to the first plane. The cross section has a first segment that abuts the first plane. The cross section also has a second segment that is between the first plane and the second plane. A tangent line positioned at a point along an edge of the cross section forms an exterior angle relative to the first axis. A value of the exterior angle has a range approximately from 50° to 120°. The edge of the cross section joins the first segment to the second segment.

In an example aspect, an apparatus for filtering is disclosed. The apparatus includes an acoustic filter configured to generate a filtered signal from a radio-frequency signal. The acoustic filter includes means for producing a formed acoustic wave. The means has two opposite surfaces that respectively form first and second planes. The acoustic filter also includes means for converting the radio-frequency signal to an acoustic wave and converting the formed acoustic wave into the filtered signal. The means for converting is at least partially embedded within the means for producing. The means for converting includes multiple fingers positioned across a first axis. A value of a metallization ratio associated with the multiple fingers is greater than approximately 0.2. A cross section of each finger of the multiple fingers has a planar surface that is perpendicular to the first plane. The cross section has a first segment that abuts the first plane. The cross section also has a second segment that is between the first plane and the second plane. A tangent line positioned at a point along an edge of the cross section forms an exterior angle relative to the first axis. A value of the exterior angle has a range approximately from 50° to 120°. The edge of the cross section joins the first segment to the second segment.

In an example aspect, a method for manufacturing a filter is disclosed. The method includes providing a piezoelectric layer having two opposite surfaces that respectively form first and second planes. The method also includes providing an electrode structure that is at least partially embedded within the piezoelectric layer. The electrode structure includes multiple fingers positioned across a first axis. A value of a metallization ratio associated with the multiple fingers is greater than approximately 0.2. A cross section of each finger of the multiple fingers has a planar surface that is perpendicular to the first plane. The cross section has a first segment that abuts the first plane and a second segment that is between the first plane and the second plane. A tangent line positioned at a point along an edge of the cross section forms an exterior angle relative to the first axis. A value of the exterior angle has a range approximately from 50° to 120°. The edge of the cross section joins the first segment to the second segment.

In an example aspect, an acoustic filter is disclosed. The acoustic filter includes a piezoelectric layer having two opposite surfaces that respectively form first and second planes. The acoustic filter also includes an electrode structure comprising multiple fingers positioned across a first axis. At least a portion of each finger of the multiple fingers extends from the first plane towards the second plane. A value of a metallization ratio associated with the multiple fingers is greater than approximately 0.2. A cross section of each finger of the multiple fingers has a quadrilateral shape with a segment that faces the second surface and a sidewall that forms an exterior angle with a line that extends from the base. A value of the exterior angle has a range approximately from 50° to 120°.

BRIEF DESCRIPTION OF DRAWINGS

FIG. 3-1 illustrates example components of an acoustic filter with an embedded electrode structure.

FIG. 3-2 illustrates example Euler angles that define an orientation of a piezoelectric layer of an acoustic filter with an embedded electrode structure.

FIG. 4-1 illustrates an example implementation of a surface-acoustic-wave filter with an embedded electrode structure.

FIG. 4-2 illustrates an example implementation of a thin-film surface-acoustic-wave filter with an embedded electrode structure.

FIG. 4-3 illustrates an example implementation of a high-quality temperature-compensated surface-acoustic-wave filter with an embedded electrode structure.

FIG. 5-1 illustrates an example embedded electrode structure of an acoustic filter.

FIG. 5-2 illustrates an example cross section of a finger of an embedded electrode structure.

FIG. 10 illustrates an impact of a height on a frequency response of an acoustic filter with an embedded electrode structure.

FIG. 12 is a flow diagram illustrating an example process for manufacturing an acoustic filter having an embedded electrode structure with particular geometric properties.

DETAILED DESCRIPTION

Figure 1:
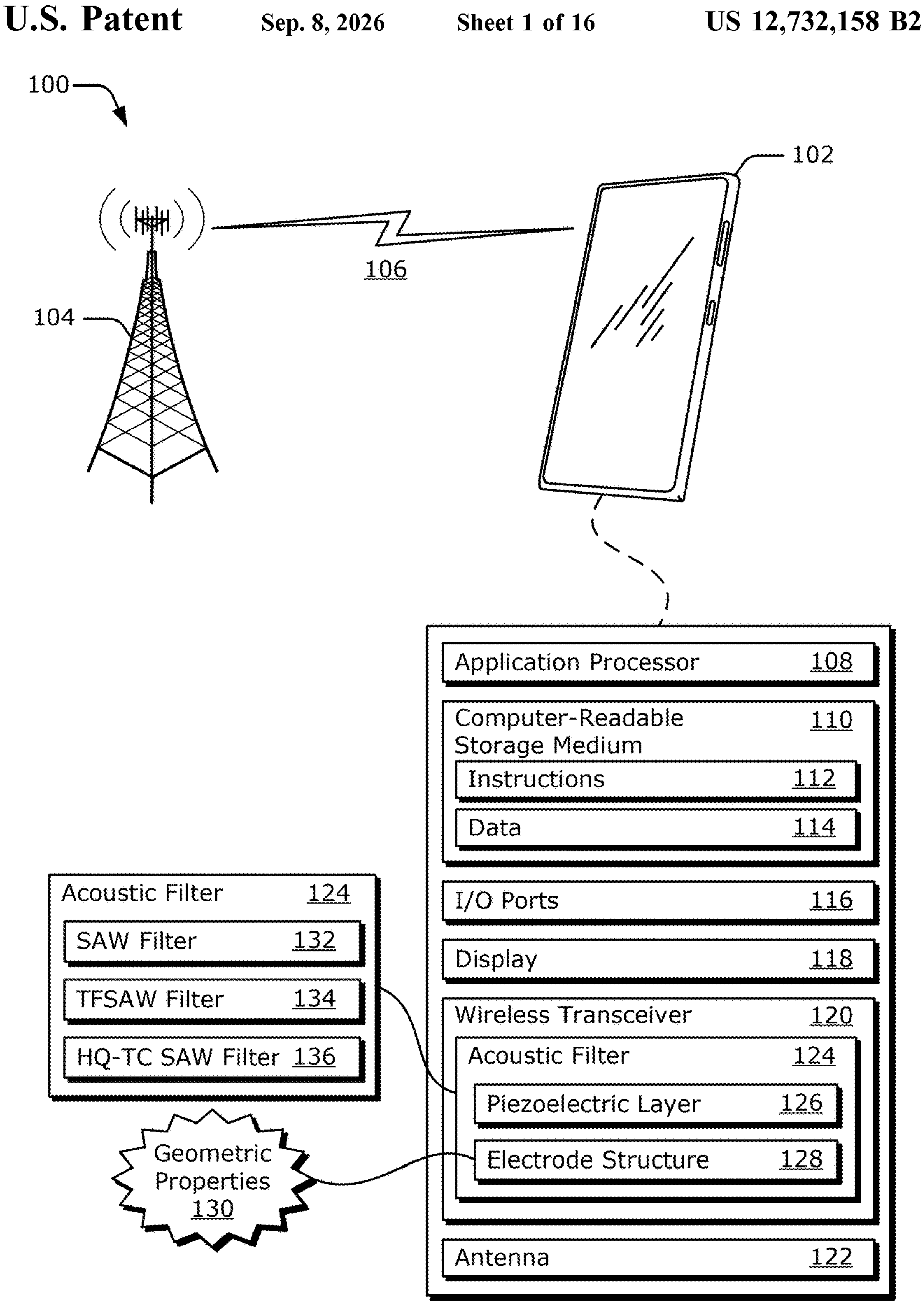
FIG. 1 illustrates an example operating environment for operating an acoustic filter with an embedded electrode structure.

To transmit or receive radio-frequency signals within a given frequency band, an electronic device may use filters to pass signals within the frequency band and to suppress (e.g., attenuate) jammers or noise having frequencies outside of the frequency band. Electroacoustic devices (e.g., "acoustic filters") can be used to filter high-frequency signals in many applications, such as those with frequencies that are greater than 100 megahertz (MHz). An acoustic filter is tuned to pass certain frequencies (e.g., frequencies within its passband) and attenuate other frequencies (e.g., frequencies that are outside of its passband). Using a piezoelectric material, the acoustic filter operates by transforming an electrical signal wave that is applied to an electrical conductor into an acoustic wave (e.g., an acoustic signal wave) that forms across the piezoelectric material. The acoustic wave is then converted back into an electrical filtered signal. The acoustic filter can include an electrode structure that transforms or converts between the electromagnetic and acoustic waves.

The acoustic wave features a velocity having a magnitude that is significantly less than that of a velocity of the electromagnetic wave. Generally, the magnitude of the propagation velocity of a wave is proportional to a size of a wavelength of the wave. Consequently, after conversion of the electrical signal wave into the acoustic signal wave, the wavelength of the acoustic signal wave is significantly smaller than the wavelength of the electrical signal wave. The resulting smaller wavelength of the acoustic signal wave enables filtering to be performed using a smaller filter device. This permits acoustic filters to be used in space-constrained devices, including portable electronic devices such as cellular phones.

It can be challenging to design an acoustic filter that can provide filtering for higher frequencies, such as those used with Wi-Fi® at 2.4 gigahertz (GHz), at 5 GHz frequencies, at greater than 5 GHz frequencies, at sub-6 GHz frequencies, at frequencies between 6 and 18 GHz, and/or at frequencies greater than or equal to 10 GHz. In particular, it can be challenging to design a filter that can fit within space-constrained devices, can be readily manufactured, can support high-frequency and/or wide-bandwidth applications, can support carrier aggregation, and/or can realize a target level of performance in terms of insertion loss, temperature stability, quality factor, and spurious-mode suppression. This challenge is due, at least in part, to the interdependency between size, bandwidth, and spurious modes. As such, many filters are designed with particular trade offs that optimize performance with respect to a first aspect while foregoing performance in a second aspect.

Some acoustic filters, such as thin-film surface-acoustic-wave filters can exhibit less insertion loss and improved temperature stability, but can be challenging to fit within space-constrained devices. Still other acoustic filters, such as a high-quality temperature-compensated filter, can realize a particular temperature stability at the cost of decreased bandwidth. The high-quality temperature-compensated filter can also lack sufficient spurious mode suppression, which can degrade a performance of an acoustic filter for carrier aggregation.

To provide certain performance improvements, techniques for implementing an acoustic filter with an embedded electrode structure having particular geometric properties. In an example aspect, the geometric properties of the embedded electrode structure can be tailored to enhance performance of the acoustic filter in terms of insertion loss, temperature stability, quality factor, and spurious-mode suppression. Furthermore, the geometric properties can enable the acoustic filter to be tuned for a particular frequency range and/or bandwidth, to fit within space-constrained devices, and improve the ease of manufacturing. Various performance improvements and design requirements can be met using the embedded electrode structure because the geometric properties of the embedded electrode structure provide additional degrees of freedom in designing the acoustic filter. This design freedom enables a performance of the acoustic filter to be optimized in the presence of multiple complex interdependencies.

FIG. 1 illustrates an example environment 100 for operating an acoustic filter with an embedded electrode structure. In the environment 100, a computing device 102 communicates with a base station 104 through a wireless communication link 106 (wireless link 106). In this example, the computing device 102 is depicted as a smartphone. However, the computing device 102 can be implemented as any suitable computing or electronic device, such as a modem, a cellular base station, a broadband router, an access point, a cellular phone, a gaming device, a navigation device, a media device, a laptop computer, a desktop computer, a tablet computer, a wearable computer, a server, a network-attached storage (NAS) device, a smart appliance or other internet of things (IoT) device, a medical device, a vehicle-based communication system, a radar, a radio apparatus, and so forth. Use of an acoustic filter is not limited to wireless communication as an acoustic filter can be applied in any technological field where such filtering is useful.

The base station 104 communicates with the computing device 102 via the wireless link 106, which can be implemented as any suitable type of wireless link. Although depicted as a tower of a cellular network, the base station 104 can represent or be implemented as another device, such as a satellite, a server device, a terrestrial television broadcast tower, an access point, a peer-to-peer device, a mesh network node, and so forth. Therefore, the computing device 102 may communicate with the base station 104 or another device via a wireless connection.

The wireless link 106 can include a downlink of data or control information communicated from the base station 104 to the computing device 102, an uplink of other data or control information communicated from the computing device 102 to the base station 104, or both a downlink and an uplink. The wireless link 106 can be implemented using any suitable communication protocol or standard, such as 2nd-generation (2G), 3rd-generation (3G), 4th-generation (4G), 5th-generation (5G), or $6^{th}$-generation (6G) cellular; IEEE 802.11 (e.g., Wi-Fi®); IEEE 802.15 (e.g., Bluetooth®); IEEE 802.16 (e.g., WiMAX®); and so forth. In some implementations, the wireless link 106 may wirelessly provide power and the base station 104 or the computing device 102 may comprise a power source.

As shown, the computing device 102 includes an application processor 108 and a computer-readable storage medium 110 (CRM 110). The application processor 108 can include any type of processor, such as a multi-core processor, that executes processor-executable code stored by the CRM 110. The CRM 110 can include any suitable type of data storage media, such as volatile memory (e.g., random access memory (RAM)), non-volatile memory (e.g., Flash memory), optical media, magnetic media (e.g., disk), and so forth. In the context of this disclosure, the CRM 110 is implemented to store instructions 112, data 114, and other information of the computing device 102, and thus does not include transitory propagating signals or carrier waves.

The computing device 102 can also include input/output ports 116 (I/O ports 116) and a display 118. The I/O ports 116 enable data exchanges or interaction with other devices, networks, or users. The I/O ports 116 can include serial ports (e.g., universal serial bus (USB) ports), parallel ports, audio ports, infrared (IR) ports, user interface ports such as a touchscreen, and so forth. The display 118 presents graphics of the computing device 102, such as a user interface associated with an operating system, program, or application. Alternatively or additionally, the display 118 can be implemented as a display port or virtual interface, through which graphical content of the computing device 102 is presented.

A wireless transceiver 120 of the computing device 102 provides connectivity to respective networks and other electronic devices connected therewith. The wireless transceiver 120 can facilitate communication over any suitable type of wireless network, such as a wireless local area network (WLAN), peer-to-peer (P2P) network, mesh network, cellular network, ultra-wideband (UWB) network, wireless wide-area-network (WWAN), and/or wireless personal-area-network (WPAN). In the context of the example environment 100, the wireless transceiver 120 enables the computing device 102 to communicate with the base station 104 and networks connected therewith. However, the wireless transceiver 120 can also enable the computing device 102 to communicate "directly" with other devices or networks.

The wireless transceiver 120 includes circuitry and logic for transmitting and receiving communication signals via an antenna 122. Components of the wireless transceiver 120 can include amplifiers, switches, mixers, analog-to-digital converters, filters, and so forth for conditioning the communication signals (e.g., for generating or processing signals). The wireless transceiver 120 can also include logic to perform in-phase/quadrature (I/Q) operations, such as synthesis, encoding, modulation, decoding, demodulation, and so forth. In some cases, components of the wireless transceiver 120 are implemented as separate transmitter and receiver entities. Additionally or alternatively, the wireless transceiver 120 can be realized using multiple or different sections to implement respective transmitting and receiving operations (e.g., separate transmit and receive chains). In general, the wireless transceiver 120 processes data and/or signals associated with communicating data of the computing device 102 over the antenna 122.

In the example shown in FIG. 1, the wireless transceiver 120 includes at least one acoustic filter 124 (e.g., a type of surface-acoustic-wave (SAW) filter). In some implementations, the wireless transceiver 120 includes multiple acoustic filters 124, which can be formed from acoustic resonators arranged in series, in parallel, in a ladder structure, in a lattice structure, or some combination thereof. The acoustic filter 124 includes at least one piezoelectric layer 126 and at least one electrode structure 128. The electrode structure 128 is at least partially embedded within the piezoelectric layer 126, as further described with respect to FIG. 5-1.

Geometric properties 130 of the electrode structure 128 are optimized to improve performance of the acoustic filter 124 relative to a similar acoustic filter 124 having an electrode structure that is disposed on a surface of an piezoelectric layer and not embedded within the piezoelectric layer. Example geometric properties 130 are further described with respect to FIG. 3-1. Embedding the electrode structure 128 within the piezoelectric layer 126 provides additional degrees of freedom to optimize a design of the acoustic filter 124. Using the described techniques, the acoustic filter 124 can be designed to fit within a space-constrained device, to be easily manufactured, to support high-frequency and/or wide-bandwidth applications, to support carrier aggregation, and/or to realize a target level of performance in terms of insertion loss, temperature stability, quality factor, and spurious-mode suppression.

With these improvements, the acoustic filter 124 can support frequency ranges above 2 GHz, including frequencies between approximately 2 and 20 GHz. For example, the acoustic filter 124 can be designed to have a resonance frequency between approximately 4 and 18 GHz, between approximately 7.5 and 15 GHz, or equal to approximately 4, 5, 6, 10, 13, 15, 17, or 20 GHz. In general, the term "approximately" can mean that any of the frequencies can be within +/−10% of a specified value or less (e.g., within +/−5%, +/−3%, or +/−2% of a specified value).

The acoustic filter 124 can be implemented as a surface-acoustic-wave filter 132 (SAW filter 132), a thin-film (TF) surface-acoustic-wave (TFSAW) filter 134 (TFSAW filter 134), or a high-quality temperature-compensated (HQ-TC) surface-acoustic-wave filter 136 (HQ-TC SAW filter 136), or another type of surface-acoustic-wave filter not shown. Examples of the surface-acoustic-wave filter 132, the thin-film surface-acoustic-wave filter 134, and the high-quality temperature-compensated surface-acoustic-wave filter 136 are respectively shown in FIGS. 4-1, 4-2, and 4-3. The acoustic filter 124 is further described with respect to FIG. 2.

Figure 2:
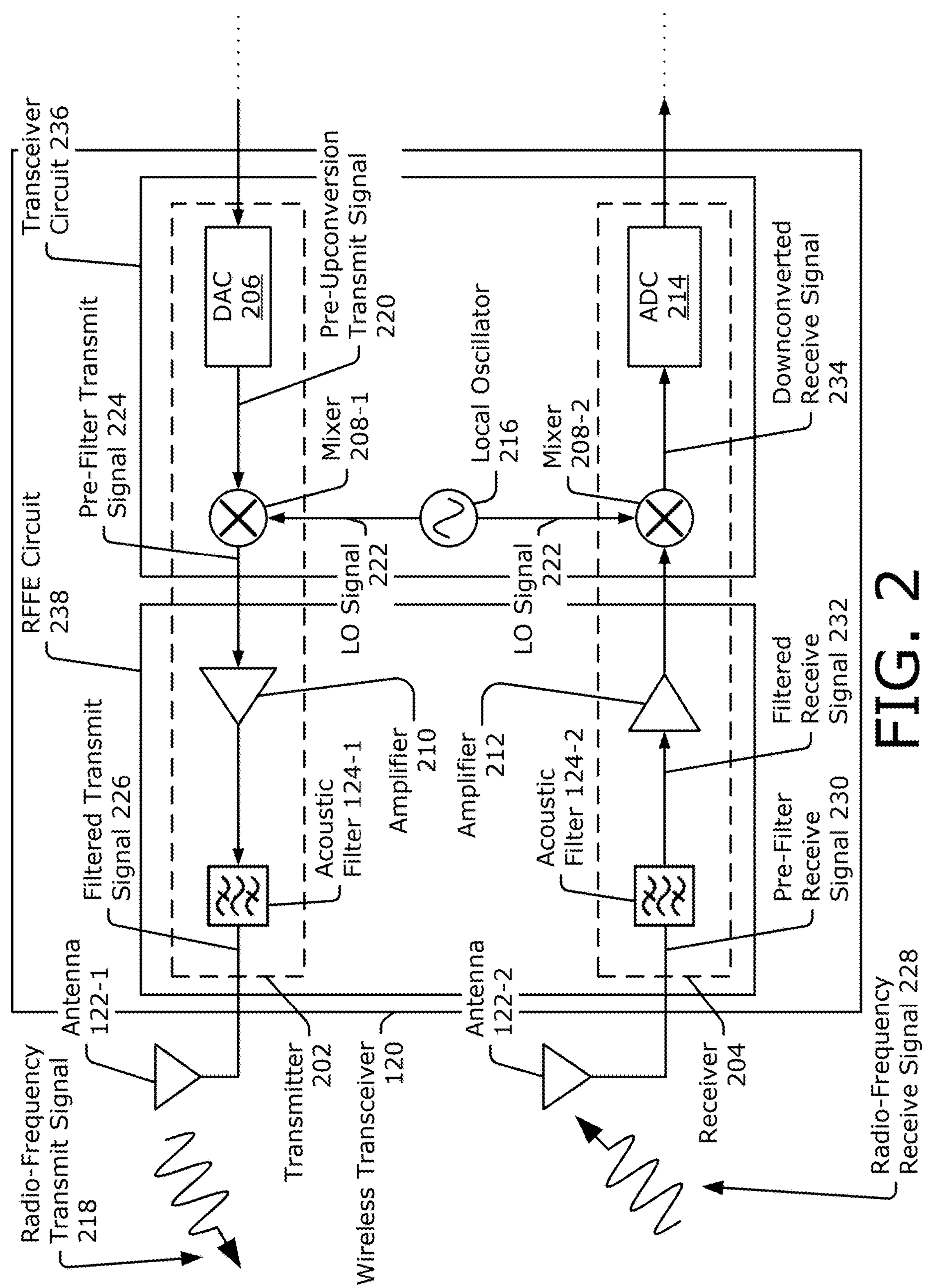
FIG. 2 illustrates an example wireless transceiver including at least one acoustic filter with an embedded electrode structure.

FIG. 2 illustrates an example wireless transceiver 120. In the depicted configuration, the wireless transceiver 120 includes a transmitter 202 and a receiver 204, which are respectively coupled to a first antenna 122-1 and a second antenna 122-2. In other implementations, the transmitter 202 and the receiver 204 can be connected to a same antenna through a duplexer (not shown). The transmitter 202 is shown to include at least one digital-to-analog converter 206 (DAC 206), at least one first mixer 208-1, at least one amplifier 210 (e.g., a power amplifier), and at least one first acoustic filter 124-1. The receiver 204 includes at least one second acoustic filter 124-2, at least one amplifier 212 (e.g., a low-noise amplifier), at least one second mixer 208-2, and at least one analog-to-digital converter 214 (ADC 214). The first mixer 208-1 and the second mixer 208-2 are coupled to a local oscillator 216. Although not explicitly shown, the digital-to-analog converter 206 of the transmitter 202 and the analog-to-digital converter 214 of the receiver 204 can be coupled to the application processor 108 (of FIG. 1) or another processor associated with the wireless transceiver 120 (e.g., a modem).

In some implementations, the wireless transceiver 120 is implemented using multiple circuits (e.g., multiple integrated circuits), such as a transceiver circuit 236 and a radio-frequency front-end (RFFE) circuit 238. As such, the components that form the transmitter 202 and the receiver 204 are distributed across these circuits. As shown in FIG. 2, the transceiver circuit 236 includes the digital-to-analog converter 206 of the transmitter 202, the mixer 208-1 of the transmitter 202, the mixer 208-2 of the receiver 204, and the analog-to-digital converter 214 of the receiver 204. In other implementations, the digital-to-analog converter 206 and the analog-to-digital converter 214 can be implemented on another separate circuit that includes the application processor 108 or the modem. The radio-frequency front-end circuit 238 includes the amplifier 210 of the transmitter 202, the acoustic filter 124-1 of the transmitter 202, the acoustic filter 124-2 of the receiver 204, and the amplifier 212 of the receiver 204.

During transmission, the transmitter 202 generates a radio-frequency transmit signal 218, which is transmitted using the antenna 122-1. To generate the radio-frequency transmit signal 218, the digital-to-analog converter 206 provides a pre-upconversion transmit signal 220 to the first mixer 208-1. The pre-upconversion transmit signal 220 can be a baseband signal or an intermediate-frequency signal. The first mixer 208-1 upconverts the pre-upconversion transmit signal 220 using a local oscillator (LO) signal 222 provided by the local oscillator 216. The first mixer 208-1 generates an upconverted signal, which is referred to as a pre-filter transmit signal 224. The pre-filter transmit signal 224 can be a radio-frequency signal and include some noise or unwanted frequencies, such as a harmonic frequency. The amplifier 210 amplifies the pre-filter transmit signal 224 and passes the amplified pre-filter transmit signal 224 to the first acoustic filter 124-1.

The first acoustic filter 124-1 filters the amplified pre-filter transmit signal 224 to generate a filtered transmit signal 226. As part of the filtering process, the first acoustic filter 124-1 attenuates the noise or unwanted frequencies within the pre-filter transmit signal 224. The transmitter 202 provides the filtered transmit signal 226 to the antenna 122-1 for transmission. The transmitted filtered transmit signal 226 is represented by the radio-frequency transmit signal 218.

During reception, the antenna 122-2 receives a radio-frequency receive signal 228 and passes the radio-frequency receive signal 228 to the receiver 204. The second acoustic filter 124-2 accepts the received radio-frequency receive signal 228, which is represented by a pre-filter receive signal 230. The second acoustic filter 124-2 filters any noise or unwanted frequencies within the pre-filter receive signal 230 to generate a filtered receive signal 232.

The amplifier 212 of the receiver 204 amplifies the filtered receive signal 232 and passes the amplified filtered receive signal 232 to the second mixer 208-2. The second mixer 208-2 downconverts the amplified filtered receive signal 232 using the local oscillator signal 222 to generate the downconverted receive signal 234. The analog-to-digital converter 214 converts the downconverted receive signal 234 into a digital signal, which can be processed by the application processor 108 or another processor associated with the wireless transceiver 120 (e.g., the modem).

FIG. 2 illustrates one example configuration of the wireless transceiver 120. Other configurations of the wireless transceiver 120 can support multiple frequency bands and share an antenna 122 across multiple transceivers. One of ordinary skill in the art can appreciate the variety of other configurations for which acoustic filters 124 may be included. For example, the acoustic filters 124 can be integrated within duplexers or diplexers of the wireless transceiver 120. Example implementations of the acoustic filter 124-1 or 124-2 are further described with respect to FIG. 3-1.

Figures 1, 3:
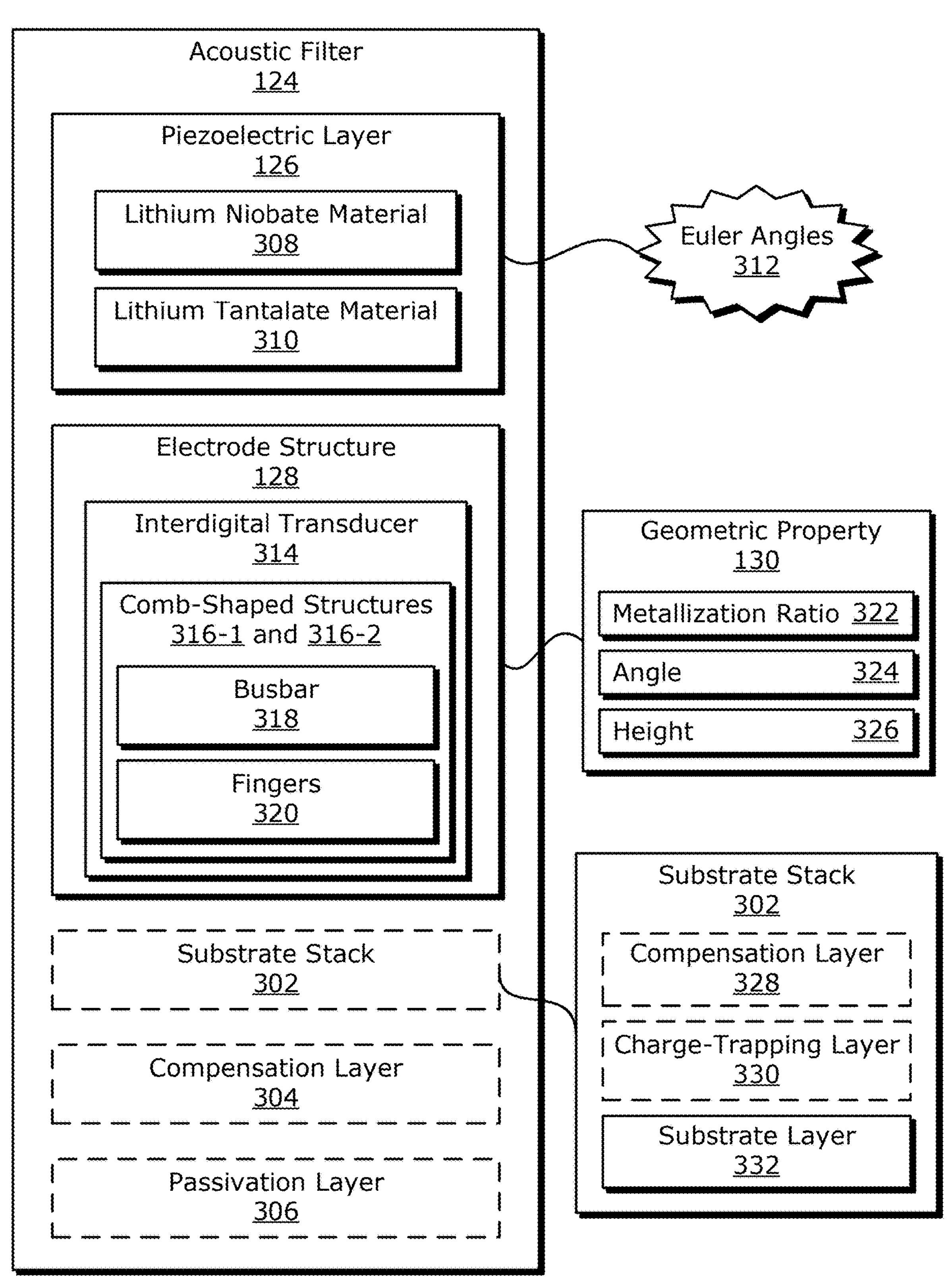
Figures 2, 3:
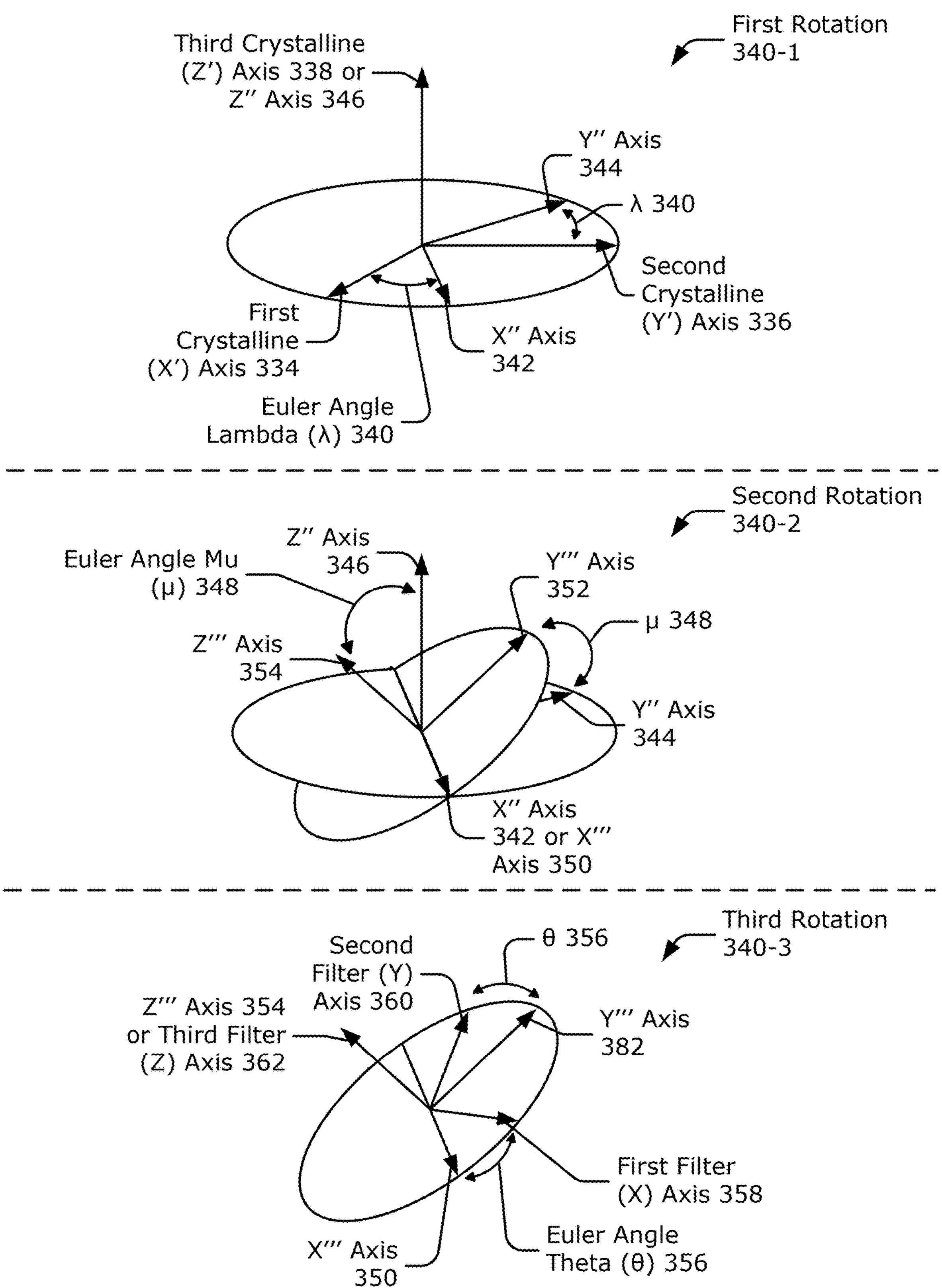

FIG. 3-1 illustrates example components of the acoustic filter 124. In the depicted configuration, the acoustic filter 124 includes the piezoelectric layer 126 and the electrode structure 128. Depending on the implementation, the acoustic filter 124 can optionally include a substrate stack 302, at least one compensation layer 304, at least one passivation layer 306, or some combination thereof.

In example implementations, the piezoelectric layer 126 can be implemented using a variety of different materials that exhibit piezoelectric properties (e.g., can transfer mechanical energy into electrical energy or electrical energy into mechanical energy). Example types of material include lithium niobate ($LiNbO_3$) material 308, lithium tantalate ($LiTaO_3$) material 310, quartz, aluminium nitride (AlN), aluminium scandium nitride (AlScN), or some combination thereof. In general, the material that forms the piezoelectric layer 126 has a crystalline structure. This crystalline structure is defined by an ordered arrangement of particles (e.g., atoms, ions, or molecules). The orientation of the crystalline structure of the piezoelectric layer 126 can be defined by Euler angles 312 lambda (λ), mu (μ), and theta (θ), which are further described with respect to FIG. 3-2. The crystalline structure is operative to excite an acoustic wave that propagates along a surface of the piezoelectric layer 126, as further described with respect to FIGS. 4-1 to 4-3.

In some aspects, the material and crystalline structure of the piezoelectric layer 126 are selected such that one or more modes can be excited along a surface of the piezoelectric layer 126 in a desired direction. The material and/or crystalline structure can also be chosen to realize a particular bandwidth. Consider an example in which the piezoelectric layer 126 is formed using the lithium niobate material 308. In a first example implementation, the lithium niobate material 308 is cut such that a value of the Euler angle mu (μ) is between approximately −70° and −50°, and values of the Euler angles lambda (λ) and theta (θ) are approximately equal to 0° (or at least one symmetrical equivalent thereof). In a second example implementation, the lithium niobate material 308 is cut such that a value of the Euler angle theta (θ) is between approximately −65° and −55°, and values of the Euler angles lambda (λ) and mu (μ) are approximately zero (or at least one symmetrical equivalent thereof). In general, the term "approximately" can mean that any of the angles can be within ±10% of a specified value or less (e.g., within ±5%, ±3%, or ±2% of a specified value). The example Euler angles 312 mentioned above in the first and second example implementations can be used to implement a surface-acoustic-wave filter 123 that is capable of exciting higher order modes. These angles, however, are presented by way of example and not limitation. Other cuts can be made to realize the piezoelectric layer 126, which may be formed from a lithium niobate or other material, for a surface-acoustic-wave filter 123. Moreover, other Euler angles 312 (as well as other materials) can be chosen to implement other types of acoustic filters, such as the thin-film surface-acoustic-wave filter 134 or the high-quality temperature-compensated surface-acoustic-wave filter 136.

Generally speaking, the Euler angles 312 can be chosen to facilitate excitation of one or more desired modes. In some cases, the excited mode can be a higher order mode, such as a second-order mode, a third-order mode, a fourth-order mode, a fifth-order mode, and so forth. In an example implementation, the higher order mode can be associated with frequencies that are between approximately 5 and 20 GHz.

The material of the piezoelectric layer 126 and the orientation of the propagation surface with respect to the crystal structure of the material affects several performance parameters. Example performance parameters include an electromechanical coupling coefficient ($k^2$) and a temperature coefficient of frequency (TCF), a mode or type of acoustic wave produced, and others. The electromechanical coupling coefficient characterizes an efficiency of the acoustic filter 124 in converting between electrical energy and mechanical energy. A filter with a higher electromechanical coupling factor experiences less insertion loss over a wider frequency range and improved impedance matching than another filter with a lower electromechanical coupling factor. One way to define the electromechanical coupling factor is further shown in Equation 1 below:

$$k^2 = \frac{\left(\frac{\pi}{2}\right)^2\left(\frac{f_s}{f_p}\right)(f_p - f_s)}{f_p} \quad \text{Equation 1}$$

where $f_s$ is the resonance frequency and $f_p$ is the antiresonance frequency. As an example, the electromechanical coupling factor of the acoustic filter 124 can be between approximately 5% and 35%.

The temperature coefficient of frequency characterizes an amount a resonant frequency or skirt of the filter changes in response to a change in temperature. A filter with a smaller absolute value of the temperature coefficient of frequency has a more stable frequency response over a range of temperatures compared to another filter with a larger absolute value of the temperature coefficient of frequency. A thickness of the piezoelectric layer 126 can be tailored to provide mode suppression (e.g., suppress a spurious plate mode), achieve a target electromechanical coupling factor, achieve a target temperature coefficient of frequency, or some combination thereof.

The electrode structure 128 comprises an electrically conductive material, such as metal, and can include one or more layers. The one or more layers can include one or more electrically conductive layers and can optionally include one or more adhesion layers and furthermore can optionally include one or more diffusion barrier layers. As an example, the electrically conductive layers can be composed of aluminium (Al), copper (Cu), silver (Ag), gold (Au), platinum (Pt), tungsten (W), silicon (Si), or some combination or doped version thereof. The adhesion layers can be composed of chromium (Cr), titanium (Ti), molybdenum (Mo), or some combination thereof. The diffusion barrier layers can be composed of aluminium oxide (Al2O3), titanium nitride (TiN), tantalum (Ta), tantalum nitride (TaN), or some combination thereof. In some implementations, the material of the electrode structure 128 can be tailored to realize a particular pitch that is easier to manufacture and/or to adjust the frequency response of the acoustic filter 124 (e.g., increase the resonant frequency).

The electrode structure 128 can include one or more interdigital transducers 314. The interdigital transducer 314 converts an electrical signal into an acoustic wave and converts the acoustic wave into a filtered electrical signal. The interdigital transducer 314 includes at least two comb-shaped structures 316-1 and 316-2. Each comb-shaped structure 316-1 and 316-2 includes a busbar 318 (e.g., a conductive segment or rail) and multiple fingers 320 (e.g., electrode fingers). An example interdigital transducer 314 is further described with respect to FIGS. 4-1 to 4-3. Although not explicitly shown, the electrode structure 128 can also include two or more reflectors. In an example implementation, the interdigital transducer 314 is arranged between two reflectors.

The electrode structure 128 is at least partially embedded within the piezoelectric layer 126. Geometric properties 130 of the electrode structure 128 provide additional degrees of freedom in designing the acoustic filter 124 and realizing a particular performance. Example geometric properties 130 include a metallization ratio 322, an angle 324 (or an exterior angle), and a height 326.

The metallization ratio 322 represents an average width of adjacent fingers 320 divided by a pitch of the interdigital transducer 314. The pitch can represent an average distance between adjacent fingers 320 of the interdigital transducer 314. The metallization ratio 322 can be represented by the Greek letter eta (η). In general, increasing the metallization ratio 322 can improve spurious-mode suppression at the cost of increasing a size of the acoustic filter 124 and/or decreasing a bandwidth of the acoustic filter 124, as further described with respect to FIGS. 6 and 8.

Figures 1, 5:
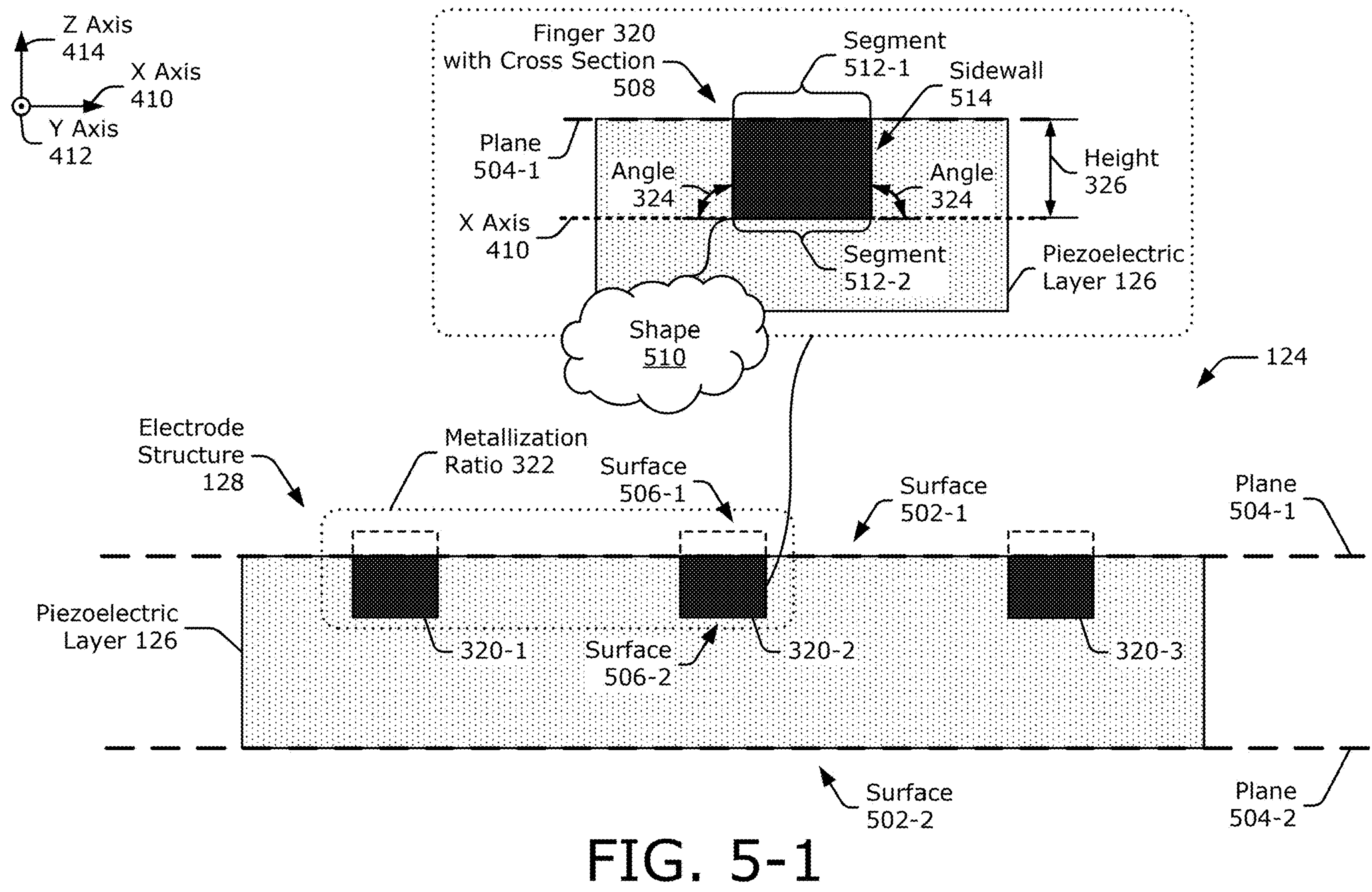
Figures 2, 5:
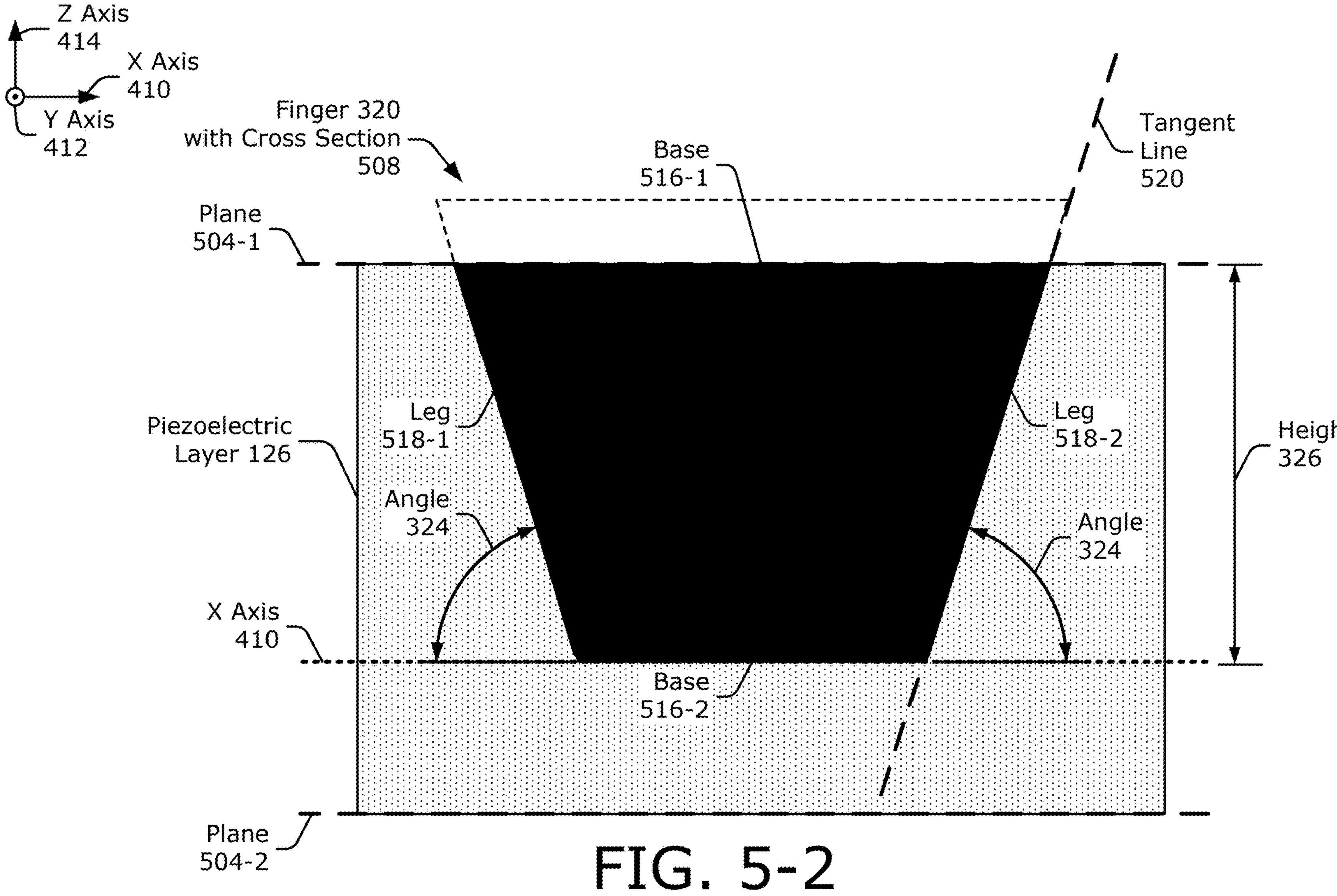

Angle 324 represents an exterior angle formed at least in part by a tangent line that is at a point along a cross section of a finger 320. Example angles 324 are depicted in FIGS. 5-1 and 5-2. In general, increasing the angle 324 can increase a bandwidth of the acoustic filter 124 and improve spurious-mode suppression at the cost of increasing a size of the acoustic filter 124, as further described with respect to FIG. 9.

The height 326 represents a height of the finger 320 that is embedded within the piezoelectric layer 126. The height 326 is further depicted in FIGS. 5-1 and 5-2. In general, increasing the height 326 can decrease a size of the acoustic filter 124 and increase a bandwidth of the acoustic filter 124 at the cost of decreasing spurious-mode suppression, as further described with respect to FIG. 10.

Some implementations of the acoustic filter 124 (e.g., the thin-film surface-acoustic-wave filter 134 of FIG. 4-2) can include the substrate stack 302. The substrate stack 302 optionally includes at least one compensation layer 328, optionally includes at least one charge-trapping layer 330, and includes at least one substrate layer 332 (or support layer). It is possible to implement the substrate stack 302 using a single layer (e.g., the substrate layer 332) or using multiple layers (e.g., multiple substrate layers 332 or some combination of the substrate layer 332, the compensation layer 328 and/or the charge-trapping layer 330). In general, the substrate stack 302 includes one or more layers that can support passivation, temperature compensation, power handling, mode suppression, and so forth. In some implementations, the substrate stack 302 may not include the compensation layer 328 and/or the charge-trapping layer 330 to reduce cost of the acoustic filter 124.

The compensation layer 328 can provide temperature compensation to enable the acoustic filter 124 to achieve the target temperature coefficient of frequency based on a thickness of the piezoelectric layer 126. In some implementations, the thickness of the compensation layer 328 can be tailored to provide mode suppression (e.g., suppress the spurious plate mode). In example implementations, the compensation layer 328 can be implemented using at least one silicon dioxide ($SiO_2$) layer, at least one doped silicon dioxide layer, at least one silicon nitride (SiN) layer, at least one silicon oxynitride (SiON) layer, or some combination thereof.

The charge-trapping layer 330 can suppress non-linear substrate effects. The charge-trapping layer 330 can include at least one polysilicon (poly-Si) layer (e.g., a polycrystalline silicon layer or a multicrystalline silicon layer), at least one amorphous silicon layer, at least one silicon nitride (SiN) layer, at least one silicon oxynitride (SiON) layer, at least one aluminum nitride (AlN) layer, diamond-like carbon (DLC), diamond, or some combination thereof.

The substrate layer 332 is composed of material that is non-conducting and provides isolation. Example materials include silicon (Si), silicon dioxide ($SiO_2$), silicon carbide (SiC), fused silica, sapphire, quartz, glass, diamond, or some combination or doped version thereof. The substrate layer 332 can have a particular crystal orientation to support the suppression or attenuation of spurious modes. In some implementations, the substrate layer 332 is composed of multiple layers. The multiple layers can be formed using the same material or different materials.

Some implementations of the acoustic filter 124 can include the compensation layer 304 and/or the passivation layer 306. The compensation layer 304 is disposed on the piezoelectric layer 126 and provides temperature compensation to enable the acoustic filter 124 to achieve a target temperature coefficient of frequency based on the thickness of the piezoelectric layer 126. In example implementations, the compensation layer 304 can be formed using silicon dioxide ($SiO_2$), or some doped version thereof. Doped versions of silicon dioxide can include fluorine-doped silicon dioxide (e.g., $SiO_xF_y$) or carbon-doped silicon dioxide (e.g., $SiO_xC_y$). In some applications, the acoustic filter 124 may not include, for instance, the compensation layer 304 to reduce cost of the acoustic filter 124.

The passivation layer 306 can be disposed on the compensation layer 304 or the piezoelectric layer 126. In an example implementation, the passivation layer 306 is formed using silicon nitride ($Si_3N_4$). The passivation layer 306 can protect the underlying layer(s) from an external environment. The thickness of the passivation layer 306 can further be used to adjust the frequency of the acoustic filter 124.

In some aspects, the acoustic filter 124 can be considered a resonator. Sometimes the acoustic filter 124 can be connected to other resonators associated with different layer stacks than the acoustic filter 124. In other aspects, the acoustic filter 124 can be implemented as multiple interconnected resonators, which use the same layers (e.g., the piezoelectric layer 126, the electrode structure 128, the substrate stack 302, the compensation layer 304, and/or the passivation layer 306). Aspects of the piezoelectric layer 126 are further described with respect to FIG. 3-2.

FIG. 3-2 illustrates example Euler angles 312 that define an orientation of the piezoelectric layer 126 relative to a crystalline structure of the material that forms the piezoelectric layer 126. In this example, the material that forms the piezoelectric layer 126 includes lithium niobate and/or lithium tantalate. A first crystalline (X') axis 334, a second crystalline (Y') axis 336, and a third crystalline (Z') axis 338 are fixed along crystallographic axes of a crystal. A first rotation 340-1 is applied to rotate the first crystalline X' axis 334 and the second crystalline Y' axis 336 about the third crystalline Z' axis 338. In particular, the first rotation 340-1 rotates the first crystalline X' axis 334 in a direction of the second crystalline Y' axis 336. The angle associated with the first rotation 340-1 characterizes one of the Euler angles 312, which is represented by Euler angle lambda (λ) 342. The resulting rotated axes are represented by a new set of axes: an X" axis 342, a Y" axis 344, and a Z" axis 346. As shown in FIG. 3-2, the third crystalline Z' axis 338 remains unchanged by the first rotation 340-1 such that the third crystalline Z' axis 338 is equal to the Z" axis 346.

In a second rotation 340-2, the Y" axis 344 and the Z" axis 346 are rotated about the X" axis 342 by another Euler angle 312, which is represented by Euler angle mu (μ) 348. In this case, the Y" axis 344 is rotated in the direction of the Z" axis 346. The resulting rotated axes are represented by a new set of axes: an X'" axis 350, a Y'" axis 352, and a Z'" axis 354. As shown in FIG. 3-2, the X" axis 342 remains unchanged by the second rotation 340-2 such that the X" axis 342 is equal to the X'" axis 350.

In a third rotation 340-3, the X'" axis 350 and the Y'" 352 axis are rotated about the Z'" axis 354 by an additional Euler angle 312, which is represented by Euler angle theta (θ) 356. In this case, the X'" axis 350 is rotated in the direction of the Y'" axis 352. The resulting rotated axes are represented by a first filter (X) axis 358, a second filter (Y) axis 360, and a third filter (Z) axis 362, which respectively correspond to the first (X) axis 410, the second (Y) axis 412, and the third (Z) axis 414 of FIGS. 4-1 to 4-3. As shown in FIG. 3-2, the Z'" axis 354 remains unchanged by the third rotation 340-3 such that the Z'" axis 354 is equal to the third filter Z axis 362. Example implementations of the acoustic filter 124 are further described with respect to FIGS. 4-1 to 4-3.

Figure 4:
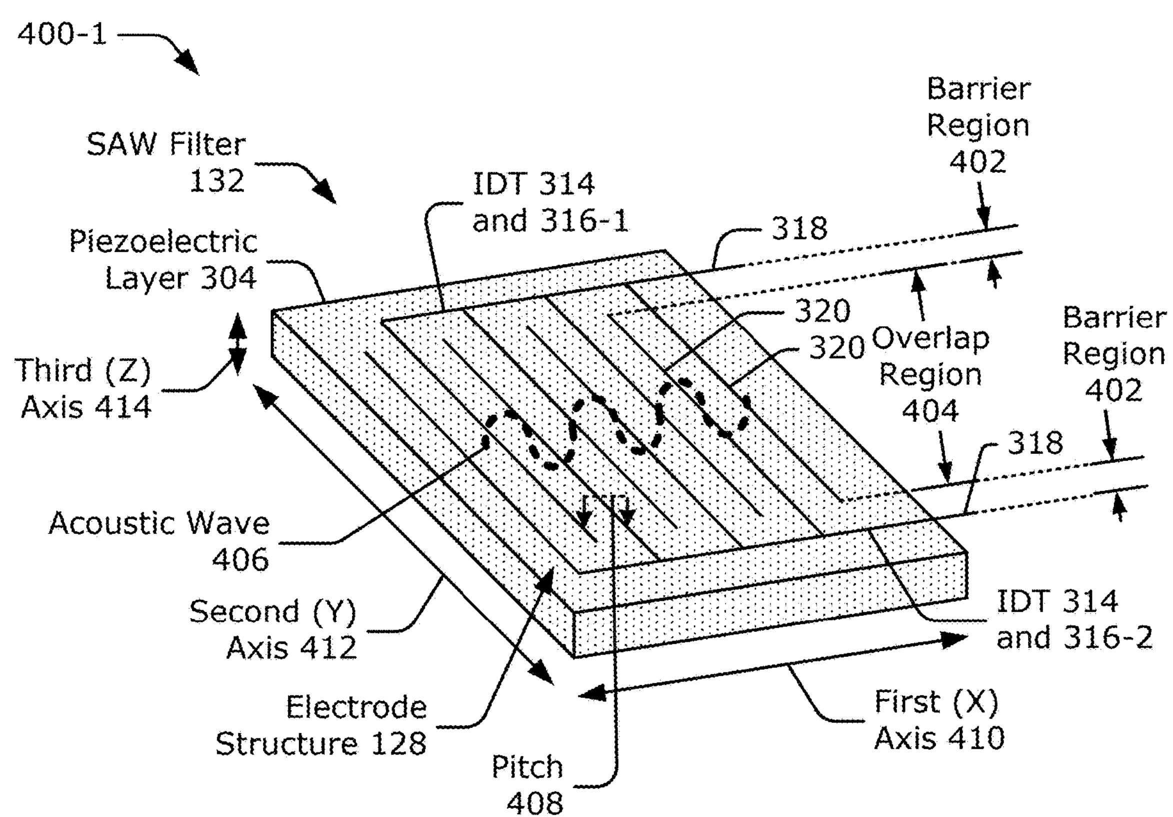
Figure 1:
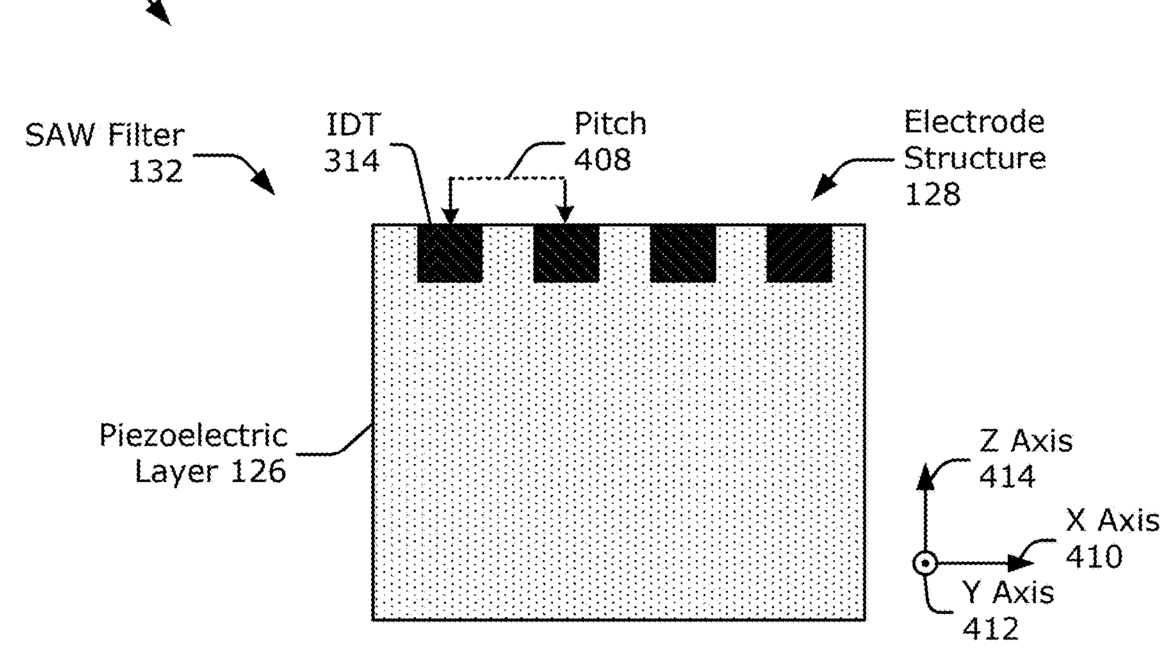
Figure 4:
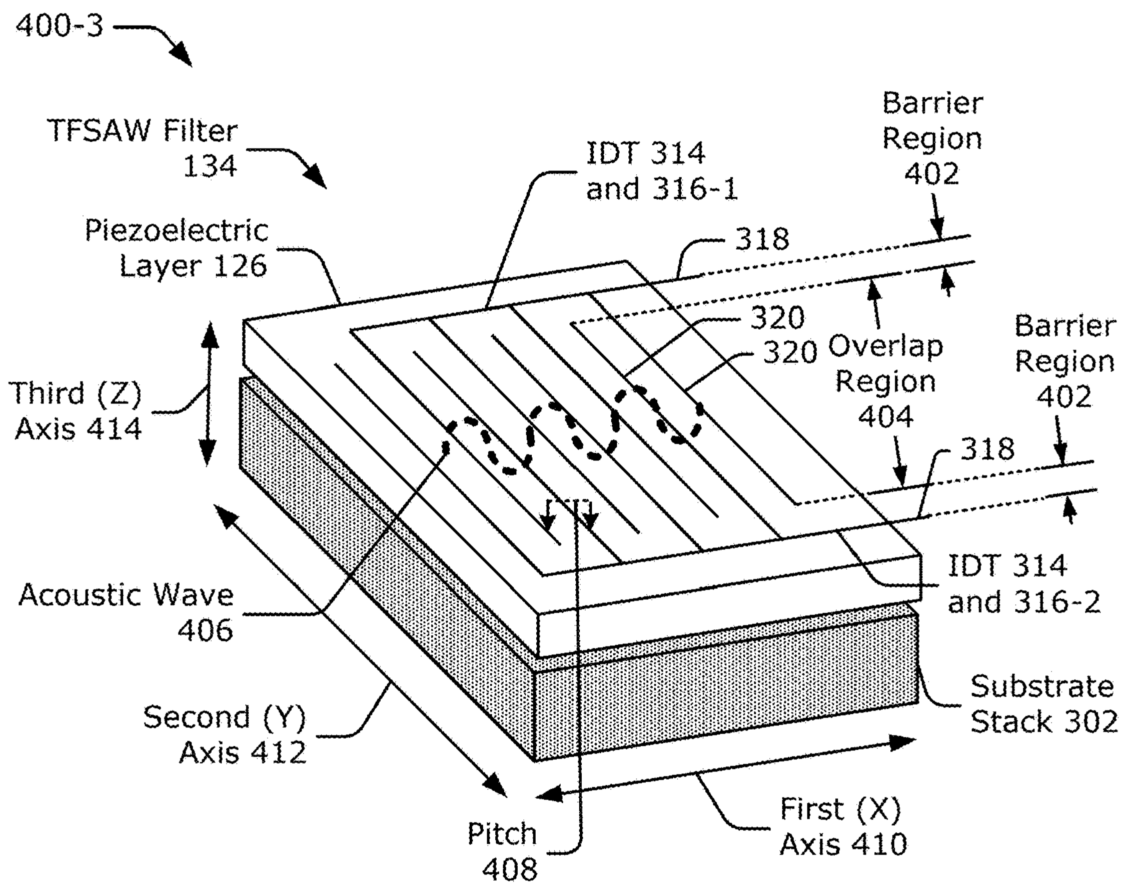
Figure 2:
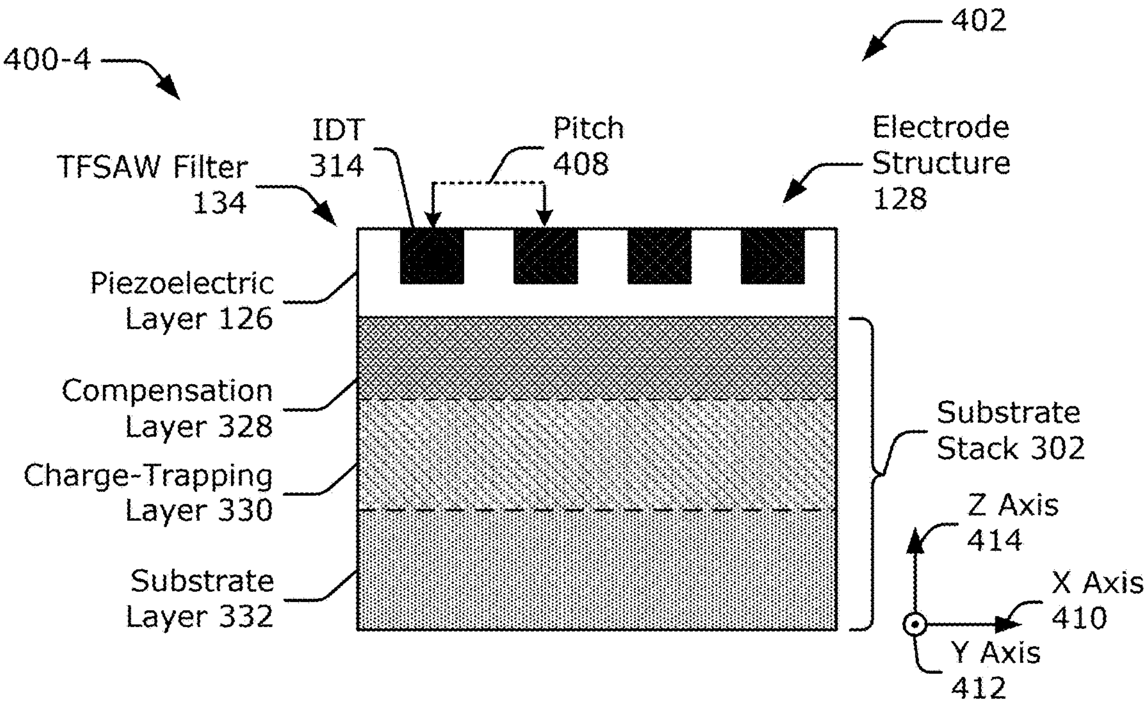

FIG. 4-1 illustrates a first example implementation of the acoustic filter 124 with an embedded electrode structure 128. In this example, the acoustic filter 124 is implemented as the surface-acoustic-wave filter 132. A three-dimensional perspective view 400-1 of the surface-acoustic-wave filter 132 is shown at the top of FIG. 4-1, and a two-dimensional cross-section view 400-2 of a portion of the surface-acoustic-wave filter 132 is shown at the bottom of FIG. 4-1.

The surface-acoustic-wave filter 132 includes the piezoelectric layer 126 and the electrode structure 128. In some example implementations, the piezoelectric layer 126 includes the lithium niobate material 308. The lithium niobate material 308 can be cut such that a value of the Euler angle mu (μ) 348 is between approximately −70° and −50° and values of the Euler angles lambda (λ) 340 and theta (θ) 356 are approximately equal to 0° (or at least one symmetrical equivalent thereof). The electrode structure 128 can include one or more interdigital transducers 314 (IDTs 314). In the depicted configuration shown in the two-dimensional cross-section view 400-2, the electrode structure 128 is at least partially embedded within the piezoelectric layer 126.

In the three-dimensional perspective view 400-1, the interdigital transducer 314 is shown to have the two comb-shaped structures 316-1 and 316-2 with fingers 320 extending from two busbars 318 towards each other. The fingers 320 are arranged in an interlocking manner in between the two busbars 318 of the interdigital transducer 314 (e.g., arranged in an interdigitated manner). In other words, the fingers 320 connected to a first busbar 318 extend towards a second busbar 318 but do not connect to the second busbar 318. As such, there is a barrier region 402 (e.g., a transversal gap region) between the ends of the fingers 320 and the second busbar 318. Likewise, fingers 320 connected to the second busbar 318 extend towards the first busbar 318 but do not connect to the first busbar 318. There is therefore a barrier region 402 between the ends of these fingers 320 and the first busbar 318.

In the direction along the busbars 318, there is an overlap region 404 where a portion of one finger 320 overlaps with a portion of an adjacent finger 320. This overlap region 404 may be referred to as the aperture, track, or active region where electric fields are produced between fingers 320 to cause an acoustic wave 406 to form at least in this region of the piezoelectric layer 126.

A physical periodicity of the fingers 320 is referred to as a pitch 408 of the interdigital transducer 314. The pitch 408 may be indicated in various ways. For example, in certain aspects, the pitch 408 may correspond to a magnitude of a distance between adjacent fingers 320 of the interdigital transducer 314 in the overlap region 404. This distance may be defined, for example, as the distance between center points of each of the fingers 320. The distance may be generally measured between a right (or left) edge of one finger 320 and the right (or left) edge of an adjacent finger 320 when the fingers 320 have uniform widths. In certain aspects, an average of distances between adjacent fingers 320 of the interdigital transducer 314 may be used for the pitch 408. The frequency at which the piezoelectric layer 126 vibrates is a main-resonance frequency of the electrode structure 128. The frequency is determined at least in part by the pitch 408 of the interdigital transducer 314 and other properties of the surface-acoustic-wave filter 132.

In the three-dimensional perspective view 400-1, the surface-acoustic-wave filter 132 is defined by a first (X) axis 410, a second (Y) axis 412, and a third (Z) axis 414. The first axis 410 and the second axis 412 are parallel to a planar surface of the piezoelectric layer 126, and the second axis 412 is perpendicular to the first axis 410. The third (Z) axis 414 is normal (e.g., perpendicular) to the planar surface of the piezoelectric layer 126. The busbars 318 of the interdigital transducer 314 are oriented to be parallel to the first axis 410. The fingers 320 of the interdigital transducer 314 are orientated to be parallel to the second axis 412. In other words, longitudinal axes of the fingers 320 are substantially parallel to the second axis 412. An orientation of the piezoelectric layer 126 causes the acoustic wave 406 to mainly form in a direction of the first axis 410. As such, the acoustic wave 406 forms in a direction that is substantially perpendicular or orthogonal to the direction of the fingers 320 of the interdigital transducers 314. Another type of acoustic filter 124 is further described with respect to FIG. 4-2.

FIG. 4-2 illustrates a second example implementation of the acoustic filter 124 with an embedded electrode structure 128. In this example, the acoustic filter 124 is implemented as the thin-film surface-acoustic-wave filter 134. A three-dimensional perspective view 400-3 of the thin-film surface-acoustic-wave filter 134 is shown at the top of FIG. 4-2, and a two-dimensional cross-section view 400-4 of a portion of the thin-film surface-acoustic-wave filter 134 is shown at the bottom of FIG. 4-2.

The thin-film surface-acoustic-wave filter 134 includes the piezoelectric layer 126, the electrode structure 128, and the substrate stack 302. In some example implementations, the piezoelectric layer 126 includes the lithium tantalate material 310. The lithium tantalate material 310 can be cut such that the Euler angles 312 enable excitation of a higher order mode. In the depicted configuration shown in the two-dimensional cross-section view 400-4, the electrode structure 128 is at least partially embedded within the piezoelectric layer 126. The piezoelectric layer 126 is disposed on "top" of the substrate stack 302. The compensation layer 328 is disposed between the piezoelectric layer 126 and the charge-trapping layer 330. The charge-trapping layer 330 is disposed between the compensation layer 328 and the substrate layer 332.

The three-dimensional perspective view 400-3 of the thin-film surface-acoustic-wave filter 134 is similar to the three-dimensional perspective view 400-1 of the surface-acoustic-wave filter 132 of FIG. 4-1. The thin-film surface-acoustic-wave filter 134, however, further includes the substrate stack 302. With the inclusion of the substrate stack 302, some implementations of the thin-film surface-acoustic-wave filter 134 can be designed with less insertion loss and enhanced temperature stability compared to the surface-acoustic-wave filter 132. However, the thin-film surface-acoustic-wave filter 134 can have a larger size compared to the surface-acoustic-wave filter 132.

FIG. 4-3 illustrates a third example implementation of the acoustic filter 124 with an embedded electrode structure 128. In this example, the acoustic filter 124 is implemented as the high-quality temperature-compensated surface-acoustic-wave filter 136. A three-dimensional perspective view 400-5 of the high-quality temperature-compensated surface-acoustic-wave filter 136 is shown at the top of FIG. 4-3, and a two-dimensional cross-section view 400-6 of a portion of the high-quality temperature-compensated surface-acoustic-wave filter 136 is shown at the bottom of FIG. 4-3.

The high-quality temperature-compensated surface-acoustic-wave filter 136 includes the piezoelectric layer 126, the electrode structure 128, the compensation layer 304, and the passivation layer 306. In some example implementations, the piezoelectric layer 126 includes the lithium niobate material 308. In the depicted configuration shown in the two-dimensional cross-section view 400-6, the electrode structure 128 is at least partially embedded within the piezoelectric layer 126. The compensation layer 304 and the passivation layer 306 are disposed on "top" of the piezoelectric layer 126 and the electrode structure 128. The compensation layer 304 is disposed between the passivation layer 306 and the piezoelectric layer 126.

The three-dimensional perspective view 400-5 of the high-quality temperature-compensated surface-acoustic-wave filter 136 is similar to the three-dimensional perspective view 400-1 of the surface-acoustic-wave filter 132 of FIG. 4-1. The high-quality temperature-compensated surface-acoustic-wave filter 136, however, further includes the compensation layer 304 and the passivation layer 306.

Generally speaking, the electrode structures 128 of the surface-acoustic-wave filter 132 of FIG. 4-1, the thin-film surface-acoustic-wave filter 134 of FIG. 4-2, and the high-quality temperature-compensated surface-acoustic-wave filter 136 of FIG. 4-3 can be similar. Likewise, the piezoelectric layer 126 of the surface-acoustic-wave filter 132 of FIG. 4-1, the thin-film surface-acoustic-wave filter 134 of FIG.

4-2, and the high-quality temperature-compensated surface-acoustic-wave filter 136 of FIG. 4-3 can have a similar material and/or crystalline structure. A thickness of the piezoelectric layer 126 of the thin-film surface-acoustic-wave filter 134 of FIG. 4-2, however, can be significantly less than the thicknesses of the piezoelectric layers 126 of the surface-acoustic-wave filter 132 of FIG. 4-1 and/or the high-quality temperature-compensated surface-acoustic-wave filter 136.

During operation, any of the acoustic filters 124 described with respect to FIGS. 4-1 to 4-3 accepts a radio-frequency signal, such as the pre-filter transmit signal 224 or the pre-filter receive signal 230 shown in FIG. 2. The electrode structure 128 excites the acoustic wave 406 within the piezoelectric layer 126 using the inverse piezoelectric effect. For example, the interdigital transducer 314 in the electrode structure 128 generates an alternating electric field based on the accepted radio-frequency signal. The piezoelectric layer 126 enables the acoustic wave 406 to be formed in response to the alternating electric field generated by the interdigital transducer 314. In other words, the piezoelectric layer 126 causes, at least partially, the acoustic wave 406 to form responsive to electrical stimulation by one or more interdigital transducers 314.

The acoustic wave 406 forms within the piezoelectric layer 126 and interacts with the interdigital transducer 314 or another interdigital transducer within the electrode structure 128 (not shown in FIGS. 4-1 to 4-3). The acoustic wave 406 that forms can be a standing wave. Using the piezoelectric effect, the electrode structure 128 generates a filtered radio-frequency signal based on the formed acoustic wave 406. In particular, the piezoelectric layer 126 generates an alternating electric field due to the mechanical stress generated by the acoustic wave 406. The alternating electric field induces an alternating current in the interdigital transducer 314. This alternating current forms the filtered radio-frequency signal, which is provided at an output of the acoustic filter 124. The filtered radio-frequency signal can include the filtered transmit signal 226 or the filtered receive signal 232 of FIG. 2.

It should be appreciated that while a certain number of fingers are illustrated in FIGS. 4-1 to 4-3, the number of actual fingers and lengths and width of the fingers and busbars may be different in an actual implementation. Such parameters depend on the particular application and desired filter characteristics. In addition, the acoustic filter 124 can include multiple interconnected electrode structures 128 each including multiple interdigital transducers 314 to achieve a desired passband (e.g., multiple interconnected resonators or interdigital transducers 314 in series or parallel connections to form a desired filter transfer function).

Although not explicitly shown, the electrode structure 128 can also include two or more reflectors. In an example implementation, the interdigital transducer 314 is arranged between two reflectors (not shown). Each reflector within the electrode structure 128 can have two busbars and a grating structure of conductive fingers that each connect to both busbars. In some implementations, the pitch of the reflector can be similar to or the same as the pitch 408 of the interdigital transducer 314. The geometric properties 130 of the electrode structure 128 are further described with respect to FIG. 5-1.

FIG. 5-1 illustrates a portion of the acoustic filter 124 with the embedded electrode structure 128. A two-dimensional cross-section view of the acoustic filter 124 is shown in FIG. 5-1 along the axes 410 and 414. The piezoelectric layer 126 of the acoustic filter 124 has a first surface 502-1 and a second surface 502-2 that is opposite the first surface 502-1. The first surface 502-1 can be referred to as a "top" surface of the piezoelectric layer 126, and the second surface 502-2 can be referred to as a "bottom" surface of the piezoelectric layer 126. In the case of the thin-film surface-acoustic-wave filter 134, the first surface 502-1 faces away from the substrate stack 302 and the second surface 502-2 faces towards the substrate stack 302. In the case of the high-quality temperature-compensated surface-acoustic-wave filter 136, the first surface 502-1 faces towards the compensation layer 304 and/or the passivation layer 306, and the second surface 502-2 faces away from the compensation layer 304 and/or the passivation layer 306. The first surface 502-1 forms a first plane 504-1, and the second surface 502-2 forms a second plane 504-2. The first and second planes 504-1 and 504-2 can be substantially parallel to each other. The first and second planes 504-1 and 504-2 extend along the first axis 410 and the second axis 412.

The electrode structure 128 is at least partially embedded within the piezoelectric layer 126. In other words, at least a portion of the electrode structure 128 is surrounded by or abuts the piezoelectric layer 126. The electrode structure 128 has a first surface 506-1 that can abut the first plane 504-1 or can be "above" the first plane 504-1 (as shown by the dashed lines). The electrode structure 128 also has a second surface 506-2 that is opposite the first surface 506-1 and/or that faces towards the second plane 504-2. In general, a distance between the second surface 506-2 and the second plane 504-2 is less than a distance between the first surface 506-1 and the second plane 504-2. The electrode structure 128 is embedded such that the second surface 506-1 is positioned between the first plane 504-1 and the second plane 504-2 along the third axis 414.

In FIG. 5-1, the electrode structure 128 is shown to include at least three fingers 320-1, 320-2, and 320-3, which are positioned across (e.g., arranged along) the first axis 410. Cross sections 508 of the fingers 320-1, 320-2, and 320-3 along the first axis 410 and the third axis 414 are shown to have a particular shape 510. In FIG. 5-1, the shapes 510 of the cross sections 508 are quadrilaterals (e.g., rectangles or trapezoids). Other shapes 510 are also possible, such a triangle, a semi-ellipse (e.g., a half ellipse), a semicircle, and so forth. In the case of the quadrilateral, the electrode structure 128 is embedded within the piezoelectric layer 126 such that at least portions of three sides of the rectangular shape abuts or is in contact with the piezoelectric layer 126. In other words, portions of the three sides are between the first and second planes 504-1 and 504-2 along the third axis 414.

Other implementations are also possible in which a dielectric material is disposed between the electrode structure 128 and the piezoelectric layer 126. In this case, the electrode structure 128 may not be in physical contact with the piezoelectric layer 126 but can still be embedded within the piezoelectric layer 126 such that an axis that is parallel to the first axis 410 passes through the piezoelectric layer 126 and the fingers 320 of the electrode structure 128.

In the case of the quadrilateral, each finger 320 has a first segment 512 that abuts the first plane 504-1 and has a second segment 512-2 that is proximate to the second plane 504-2. The first segment 512-1 represents the first surface 506-1 of the electrode structure 128, and the second segment 512-2 represents the second surface 506-2 of the electrode structure 128. The finger 320 also has two sidewalls 514, which face in opposite directions. The sidewalls 514 join the segments 512-1 and 512-2 together.

A line extends from the segment 512-2 along the first axis 410 to form an angle 324 with the sidewall 514. This angle 324 can also be referred to as an exterior angle of the shape 510. In some implementations, a length of the first segment 512-1 along the first axis 410 is larger than the length of the second segment 512-2 along the first axis 410. In this case, the angle 324 can be less than 90°. In other implementations, a length of the first segment 512-1 along the first axis 410 is smaller than the length of the second segment 512-2 along the first axis 410. In this case, the angle 324 can be greater than 90° and less than 180°.

The height 326 of the electrode structure 128 is defined as a distance between the first segment 512-1 and the second segment 512-2. If the shape 510 is a rectangle, as depicted in FIG. 5-1, the height 326 represents a length of the sidewall 514. Another example shape 510 of the cross section 508 of the finger 320 is further described with respect to FIG. 5-2.

FIG. 5-2 illustrates an example cross section 508 of a finger 320 of the electrode structure 128. In the depicted configuration, the cross section 508 of the finger 320 is in a shape of a trapezoid. The trapezoid includes a first base 516-1, a second base 516-2, a first leg 518-1, and a second leg 518-2. The first and second bases 516-1 and 516-2 respectively represent the first and second segments 512-1 and 512-2 of FIG. 5-1. The legs 518-1 and 518-2 represent the sidewalls 514 of FIG. 5-1. In this case, the height 326 of the electrode structure 128 represents a distance between the first and second bases 516-1 and 516-2 (e.g., the height 326 represents an altitude of the trapezoid).

The angle 324 represents an exterior angle of the trapezoid. More specifically, the angle 324 is formed between one of the legs 518-1 or 518-2 and a line that extends from the second base 516-2 along the first axis 410. Generally speaking for any shape 510 of the cross section 508, the angle 324 forms between a tangent line 520 that is positioned at a point along an edge of the cross section 508 and the first axis 410. This point is along an edge of the cross section 508 and is between the first and second planes 504-1 and 504-2.

By tailoring two or more geometric properties 130 of the electrode structure 128, the acoustic filter 124 can realize a target level of performance. Example geometric properties 130 include the metallization ratio 322, the angle 324, and/or the height 326 of the electrode structure 128. Other aspects or characteristics of the acoustic filter 124 can also be tailored, including the pitch 408, the material of the electrode structure 128, the material and cut of the piezoelectric layer 126, a thickness of one or more layers of the acoustic filter 124, and so forth. A relationship between the metallization ratio 322, the angle 324 and characteristics of the acoustic filter 124 are further described with respect to FIG. 6.

Figure 6:
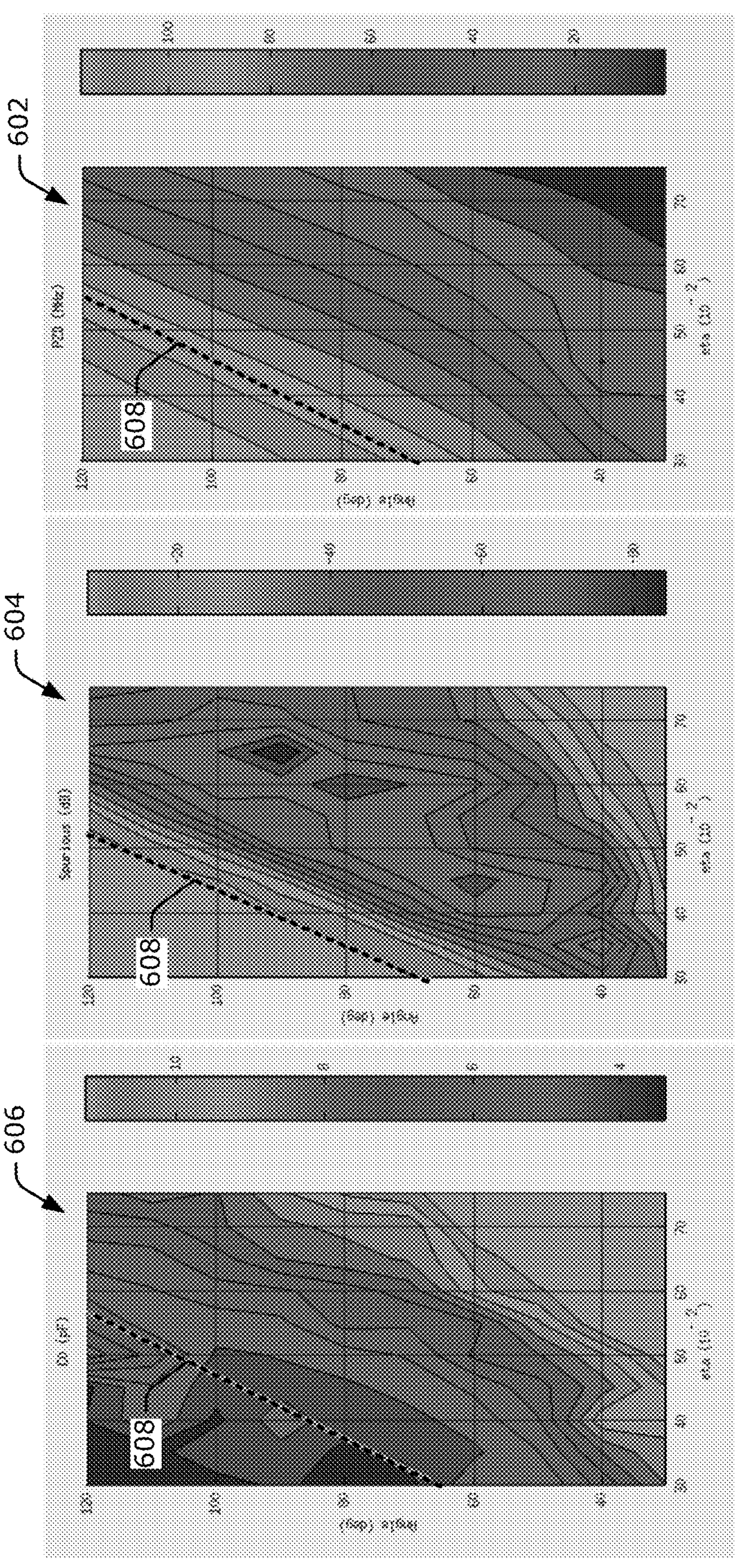
FIG. 6 illustrates example interdependencies between bandwidth, spurious-mode suppression, and size for various geometric properties of an embedded electrode structure.

FIG. 6 illustrates example interdependencies between bandwidth, spurious-mode suppression, and size for various geometric properties 130 of the embedded electrode structure 128. Three graphs 602, 604, and 606 are depicted in FIG. 6. The metallization ratio 322 (e.g., eta) is depicted along horizontal axes. The angle 324 is depicted along vertical axes of these graphs.

The first graph 602 depicts the relationship between the metallization ratio 322, the angle 324, and the pole-zero distance (PZD). Different shades of the graph 602 depict different pole-zero distances. A lighter shade represents a larger pole-zero distance, and a darker shade representing a smaller pole-zero distance. The pole-zero distance determines a bandwidth of the acoustic filter 124. For wide-band applications, it is desirable to design the acoustic filter 124 to have a larger pole-zero distance. As seen in the graph 602, larger pole-zero distances can be realized with smaller metallization ratios 322 and larger angles 324.

The second graph 604 depicts the relationship between the metallization ratio 322, the angle 324, and spurious-mode suppression. Different shades of the graph 604 depict different attenuation amounts of a spurious mode. A lighter shade represents less spurious-mode suppression, and a darker shade represents more spurious-mode suppression. As seen in the graph 604, better spurious-mode suppression can be realized with metallization ratios 322 and angles 324 that are in the middle of the graph 604.

The third graph 606 depicts the relationship between the metallization ratio 322, the angle 324, and the static capacity of the acoustic filter 124. Different shades of the graph 606 depict different amounts of static capacity. A lighter shade represents a larger static capacity, and a darker shade represents a smaller static capacity. The static capacity impacts an overall footprint of the acoustic filter 124. Acoustic filters 124 with larger static capacities can be implemented with smaller footprints compared to other acoustic filters 124 with smaller static capacities. As such, it can be desirable to design the acoustic filter 124 with a particular static capacity so that the acoustic filter 124 can fit within space-constrained devices. As seen in the graph 604, larger static capacities can be realized with larger metallization ratios 322 and smaller angles 324.

Considering the graphs 602, 604, and 606, the bandwidth, spurious-mode suppression, and static capacity cannot be optimized individually due to the interdependency with the metallization ratio 322 and the angle 324. However, these features of the acoustic filter 124 can be optimized together by tailoring at least the metallization ratio 322 and the angle 324 of the embedded electrode structure 128. At 608 in the graphs 602, 604, and 606, values of the metallization ratio 322 and the angle 324 are identified that optimize the bandwidth, the spurious-mode suppression, and the size of the acoustic filter 124 for a particular application and/or for a particular set of requirements.

In example implementations, the electrode structure 128 can have a metallization ratio 322 with a value having a range that is approximately greater than or equal to 0.2. The electrode structure 128 can also have an angle 324 with a value having a range approximately from 50° to 120°. For example, the angle 324 can be approximately equal to 50°, 60°, 70°, 80°, 90°, 100°, 110°, or 120°. In some implementations, the angle 324 can further have a range approximately from 60° to 90° or from 90° to 120°. Optionally, the electrode structure 128 can also have a height 326 with a value having a range approximately from 5% and 20% of a wavelength of the acoustic wave 406. In an example implementation, the value of the height 326 can have a range approximately from 100 and 500 nanometers (nm). In general, the term "approximately" can mean that any of the values can be within +/−10% of a specified value or less (e.g., within +/−5%, +/−3%, or +/−2% of a specified value). The range of values can be further narrowed for various types of filters, as further described below.

To optimize performance of the surface-acoustic-wave filter 132, the value of the metallization ratio 322 further has a range approximately from 0.3 to 0.6, for instance. Also, the value of the angle 324 further has a range approximately from 60° to 90°.

To optimize performance of the thin-film surface-acoustic-wave filter 134, the value of the metallization ratio 322 further has a range approximately from 0.3 to 0.6. Also, the value of the angle 324 further has a range approximately from 60° to 90°.

To optimize performance of the high-quality temperature-compensated surface-acoustic-wave filter 136, the value of the metallization ratio 322 further has a range that is greater than or equal to 0.2. Also, the value of the angle 324 further has a range approximately from 60° to 90°.

The geometric properties 130 can also be tailored to optimize additional features of the acoustic filter 124, including insertion loss (e.g., the electromechanical coupling coefficient) and temperature stability (e.g., a temperature coefficient of frequency). In some cases, the geometric properties 130 are tailored to compensate for other design choices. By tailoring the geometric properties 130 of the embedded electrode structure 128, and in particular the metallization ratio 322 and the angle 324, the acoustic filter 124 can realize better performance than other filters that do not utilize an embedded electrode structure. An example frequency response of the acoustic filter 124 is further described with respect to FIG. 7.

Figure 7:
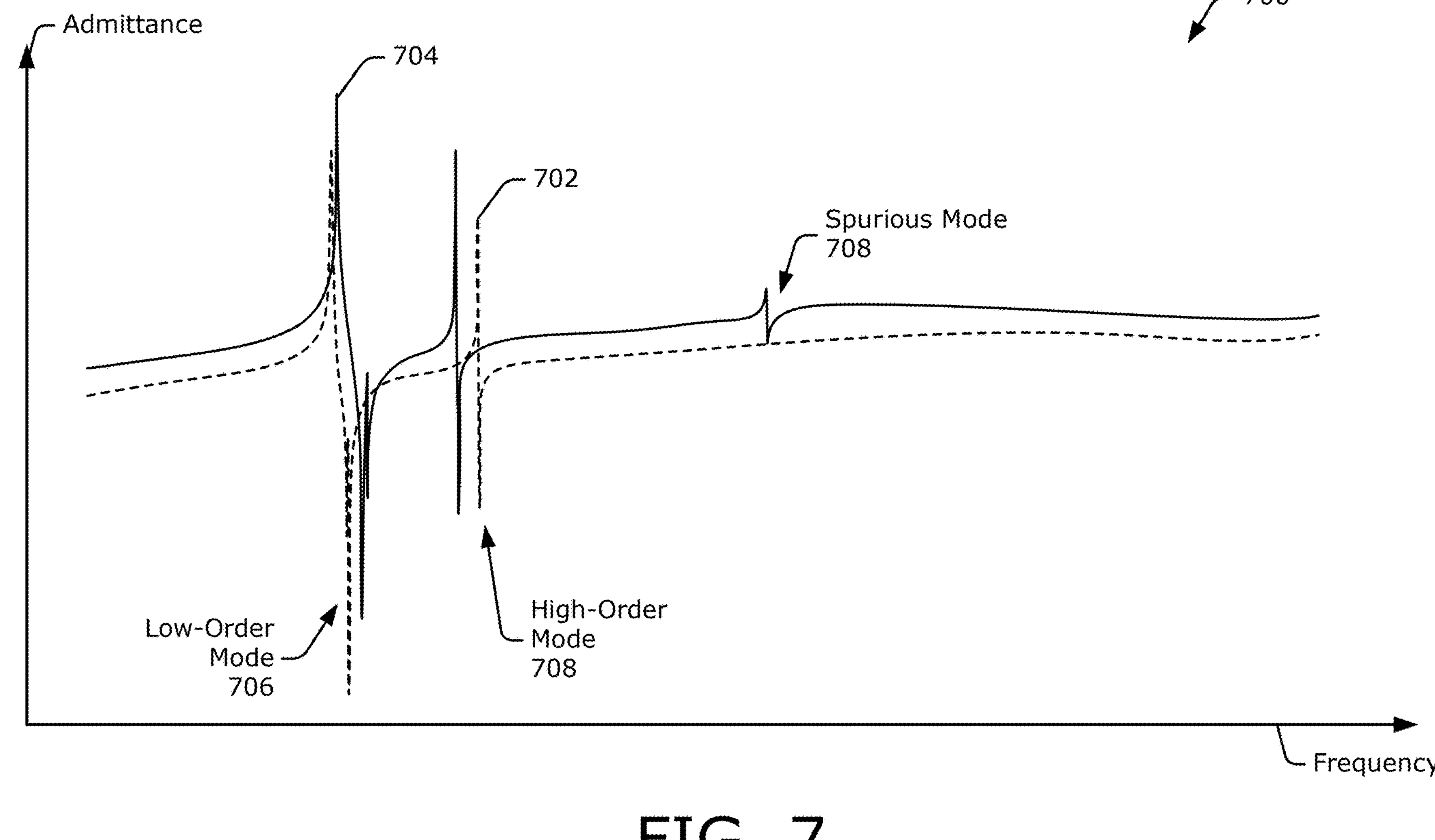
FIG. 7 illustrates example frequency responses for implementations of an acoustic filter with and without an embedded electrode structure.

FIG. 7 illustrates example frequency responses of an acoustic filter 124 with an embedded electrode structure 128 and another acoustic filter with a non-embedded electrode structure. A graph 700 depicts a frequency response 702 of another acoustic filter using dashed lines. In contrast to the acoustic filter 124 described herein, this other acoustic filter has a non-embedded electrode structure. Instead, the electrode structure is disposed on a surface of the piezoelectric layer.

The graph 700 also depicts, using a solid line, a frequency response 704 of the acoustic filter 124 having the embedded electrode structure 128. The geometric properties 130 of the embedded electrode structure 128 are with a certain range of values to enhance performance of the acoustic filter 124 relative to the other acoustic filter. Generally speaking, the acoustic filter 124 can be the surface-acoustic-wave filter 132, the thin-film surface-acoustic-wave filter 134, or the high-quality temperature-compensated filter 136.

In comparing the frequency response 704 of the acoustic filter 124 to the frequency response 702 of the other acoustic filter, an admittance of the acoustic filter 124 is higher than the admittance of the other acoustic filter. A higher admittance indicates a higher static capacity, which can enable the acoustic filter 124 to be implemented with a smaller footprint than the other acoustic filter.

At a low-order mode 706 (or a low-order excitation mode), the frequency response 704 has a larger pole-zero distance compared to the frequency response 702. As such, the frequency response 704 of the acoustic filter 124 has a wider bandwidth relative to the frequency response 704 of the other acoustic filter 124. The low-order mode 706 can correspond to a first-order mode or a second-order mode, for instance.

At a high-order mode 708 (or a high-order excitation mode), the frequency response 704 has a larger peak admittance compared to the frequency response 702. This means that the frequency response 704 has less insertion loss at the high-order mode 708 compared to the frequency response 702. The high-order mode 708 can correspond to a third-order mode or a fifth-order mode, for instance. In general, the high-order mode 708 represents a mode with a higher order than the low-order mode 706.

In an example implementation of the surface-acoustic-wave filter 132 or the thin-film surface-acoustic-wave filter 134, the low-order mode 706 represents a first-order mode that is centered at frequencies around 2.5 GHz. Also, the high-order mode 708 represents a third-order mode that is centered at frequencies around 8 GHz. In an example implementation of the high-quality temperature-compensated surface-acoustic-wave filter 136, the low-order mode 706 represents a first-order mode that is centered at frequencies around 1.8 GHz. Also, the high-order mode 708 is centered at frequencies around 2.25 GHz.

The high-order mode 708 enables the acoustic filter 124 to pass frequencies associated with multiple frequency bands. As such, a larger quantity of frequency bands can be supported by the acoustic filter 124 compared to other acoustic filters. This means that the computing device 102 can be implemented with fewer acoustic filters 124, which can conserve space within the computing device 102.

In summation, the techniques for tailoring the geometric properties 130 of the embedded electrode structure 128 can enable the acoustic filter 124 to fit within space-constrained devices, support wide-bandwidth and/or high-frequency applications, and/or support carrier aggregation. An impact of adjusting various geometric properties 130 of the embedded electrode structure 128 is further described with respect to FIGS. 8 to 10.

Figure 8:
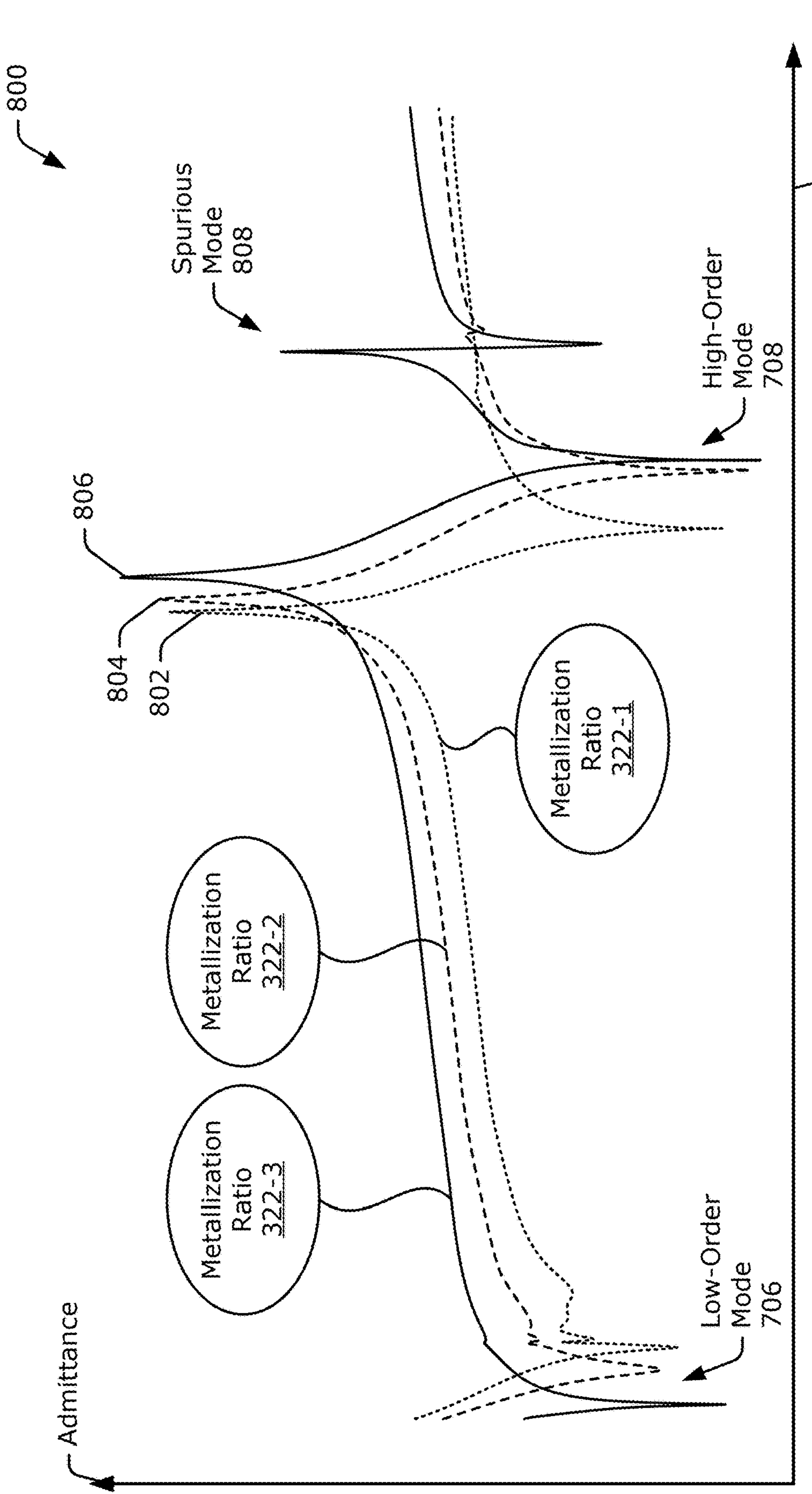
FIG. 8 illustrates an impact of a metallization ratio on a frequency response of an acoustic filter with an embedded electrode structure.

FIG. 8 illustrates an impact of a metallization ratio 322 on a frequency response of an acoustic filter 124 with an embedded electrode structure 128. A graph 800 depicts three frequency responses 802, 804, and 806 corresponding to acoustic filters 124 having embedded electrode structures 128 with increasing metallization ratios 322. The frequency responses 802, 804, and 806 have the low-order mode 706 and the high-order mode 708.

The frequency responses 802, 804, and 806 are respectively associated with metallization ratios 322-1, 322-2, and 322-3. The second metallization ratio 322-2 is greater than the first metallization ratio 322-1. Also, the third metallization ratio 322-3 is greater than the second metallization ratio 322-2. In FIG. 8, the metallization ratios 322-1, 322-2, and 322-3 are respectively equal to 0.4, 0.5, and 0.6. Other example values are also possible.

By comparing the frequency responses 802, 804, and 806, it can be seen that increasing the metallization ratio 322 increases the pole-zero distance and therefore increases a bandwidth of the acoustic filter 124. It can also be seen that a spurious mode 808 is introduced in the frequency response 806. As such, increasing the metallization ratio 322 too much can degrade spurious-mode suppression. Additionally, increasing the metallization ratio 322 can increase the static capacity of the acoustic filter 124. As such, the acoustic filter 124 with the frequency response 806 can be implemented with a smaller footprint compared to the acoustic filters 124 with the frequency responses 802 and 804. In terms of insertion loss, increasing the metallization ratio 322 reduces the insertion loss at the high-order mode 708. For example, the acoustic filter 124 with the frequency response 806 experiences less insertion loss compared to the acoustic filters 124 with the frequency responses 802 and 804. The angle 324 can also be tailored to optimize features of the acoustic filter 124, as further described with respect to FIG. 9.

Figure 9:
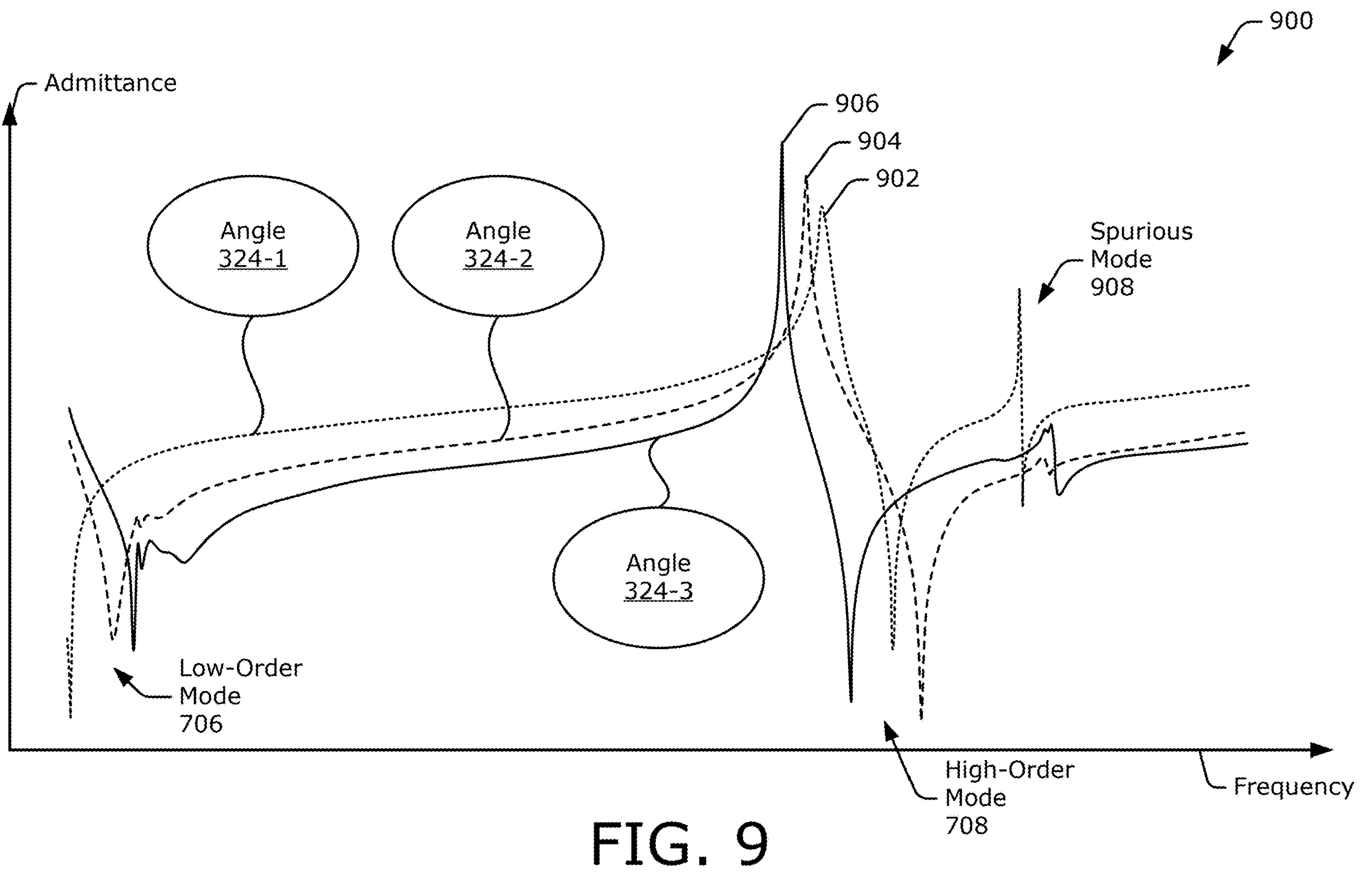
FIG. 9 illustrates an angle on a frequency response of an acoustic filter with an embedded electrode structure.

FIG. 9 illustrates an impact of an angle 324 on a frequency response of an acoustic filter 124 with an embedded electrode structure 128. A graph 900 depicts three frequency responses 902, 904, and 906 corresponding to acoustic filters 124 having embedded electrode structures 128 with increasing angles 324.

The frequency responses 902, 904, and 906 are respectively associated with angles 324-1, 324-2, and 324-3. The second angle 324-2 is larger than the first angle 324-1. The third angle 324-3 is larger than the second angle 324-2. In FIG. 9, the angles 324-1, 324-2, and 324-3 are respectively equal to 70°, 80°, and 90°. Other values are also possible.

By comparing the frequency responses 902, 904, and 906, it can be seen that increasing the angle 324 can vary the pole-zero distance and therefore vary the bandwidth of the acoustic filter 124. At the high-order mode 708, a bandwidth of the frequency response 904 is larger than the bandwidths of the frequency responses 902 and 906. It can also be seen that spurious-mode suppression is dependent on the angle 324. The frequency response 902 has poorer spurious-mode suppression compared to the frequency responses 904 and 906, for instance. Additionally, increasing the angle 324 can decrease the static capacity of the acoustic filter 124. As such, the acoustic filter 124 with the frequency response 906 can have a larger footprint compared to the acoustic filters 124 with the frequency responses 902 and 904. In terms of insertion loss, increasing the angle 324 reduces the insertion loss at the high-order mode 708. For example, the acoustic filter 124 with the frequency response 906 experiences less insertion loss compared to the acoustic filters 124 with the frequency responses 902 and 904. The height 326 can also be tailored to optimize features of the acoustic filter 124, as further described with respect to FIG. 10.

FIG. 10 illustrates an impact of a height 326 on a frequency response of an acoustic filter 124 with an embedded electrode structure 128. A graph 1000 depicts three frequency responses 1002, 1004, and 1006 corresponding to acoustic filters 124 having embedded electrode structures 128 with increasing heights 326.

The frequency responses 1002, 1004, and 1006 are respectively associated with heights 326-1, 326-2, and 326-3. The second height 326-2 is larger than the first height 326-1. The third height 326-3 is larger than the second height 326-2. In FIG. 10, the heights 326-1, 326-2, and 326-3 are respectively equal to 200 nm, 300 nm, and 400 nm.

By comparing the frequency responses 1002, 1004, and 1006, it can be seen that increasing the height 326 can increase the pole-zero distance and therefore increase the bandwidth of the acoustic filter 124. At the high-order mode 708, a bandwidth of the frequency response 1006 is wider than the bandwidths of the frequency responses 1002 and 1004. It can also be seen that spurious-mode suppression is dependent on the height 326. The frequency response 1004 has poorer spurious-mode suppression compared to the frequency responses 1002 and 1006, for instance. Additionally, increasing the height 326 can increase the static capacity of the acoustic filter 124. As such, the acoustic filter 124 with the frequency response 1006 can have a smaller footprint compared to the acoustic filters 124 with the frequency responses 1002 and 1004. In terms of insertion loss, increasing the height 326 reduces the insertion loss at the high-order mode 708. For example, the acoustic filter 124 with the frequency response 1006 experiences less insertion loss compared to the acoustic filters 124 with the frequency responses 1002 and 1004.

Examples values mentioned with respect to FIGS. 7 to 10 can be used to implement the surface-acoustic-wave filters 132 or the thin-film surface-acoustic-wave filter 134. In general, the surface-acoustic-wave filters 132 and the thin-film surface-acoustic-wave filter 134 can be designed to support high-frequency applications (e.g., frequencies greater than 2.5 GHz).

The example values of FIGS. 7 to 10 can be further tailored to implement the high-quality temperature-compensated surface-acoustic-wave filter 136. The high-quality temperature-compensated surface-acoustic-wave filter 136 can also see similar impacts in the frequency response by changing the metallization ratio 322, the angle 324, and/or the height 326. Generally speaking, the high-quality temperature-compensated surface-acoustic-wave filter 136 is designed to support lower-frequency applications (e.g., frequencies below 2.5 GHz). As such, the high-quality temperature-compensated surface-acoustic-wave filter 136 can excite the low-order mode 706 and may optionally be designed to excite the high-order mode 708. A frequency response of an example high-quality temperature-compensated surface-acoustic-wave filter 136 is further described with respect to FIG. 11.

Figure 11:
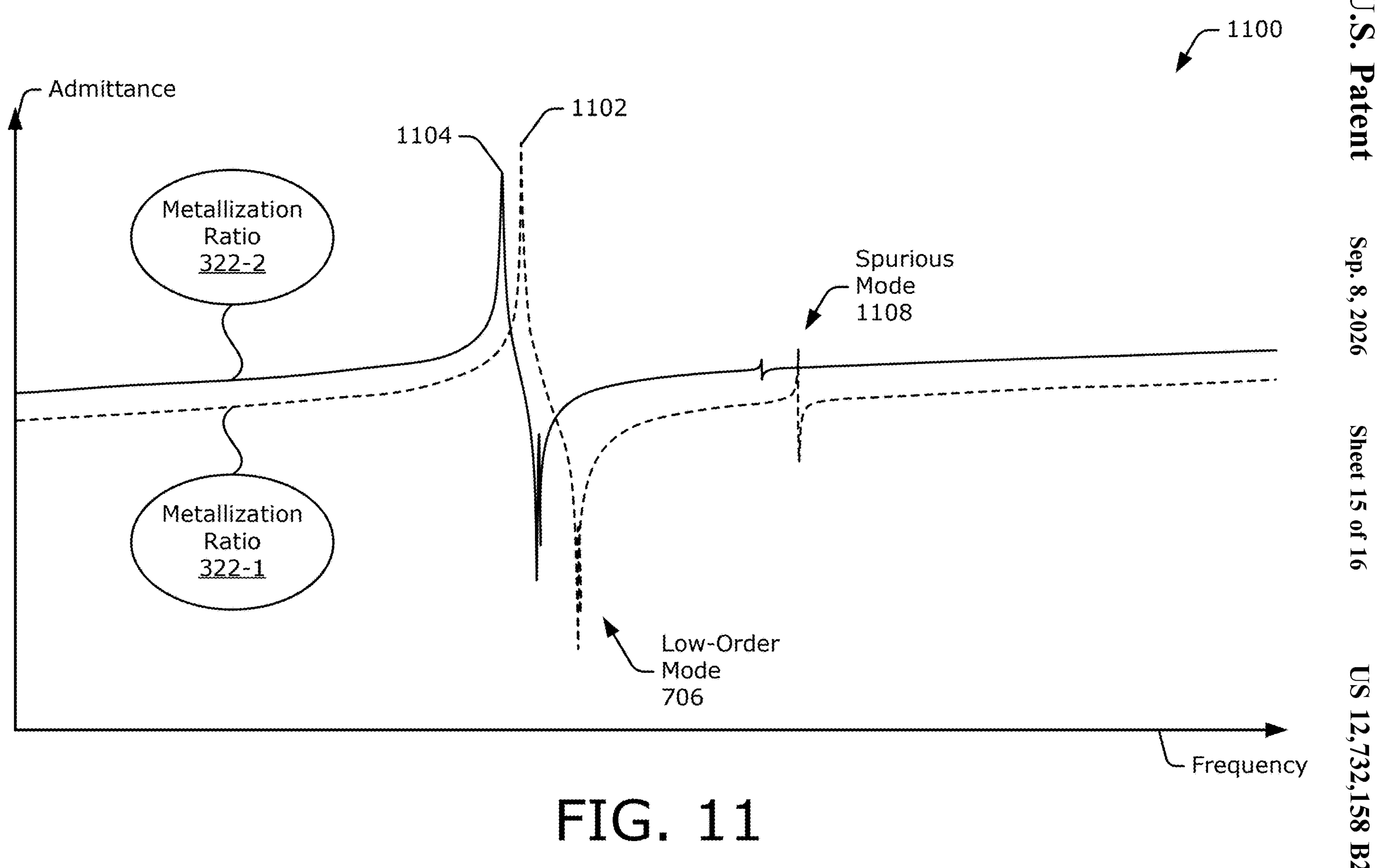
FIG. 11 illustrates an impact of a metallization ratio on a frequency response of a high-quality temperature-compensated surface-acoustic-wave filter with an embedded electrode structure.

FIG. 11 illustrates an impact of a metallization ratio 322 on a frequency response of a high-quality temperature-compensated surface-acoustic-wave filter 136 with an embedded electrode structure 128. A graph 1100 depicts two frequency responses 1102 and 1104 corresponding to acoustic filters 124 having embedded electrode structures 128 with increasing metallization ratios 322. The frequency responses 1102 and 1104 have the low-order mode 706. In FIG. 11, the low-order mode 706 represents a first-order mode that is centered at frequencies around 1.8 GHz. In contrast to the acoustic filters 124 described above with respect to FIGS. 8 to 10, the high-quality temperature-compensated surface-acoustic-wave filter 136 depicted in FIG. 11 substantially suppresses the high-order mode 708.

The frequency responses 1102 and 1104 are respectively associated with metallization ratios 322-1 and 322-2. The second metallization ratio 322-2 is larger than the first metallization ratio 322-1. In FIG. 11, the metallization ratios 322-1 and 322-2 are respectively equal to 0.4 and 0.7. Other values are also possible.

By comparing the frequency responses 1102 and 1104, it can be seen that increasing the metallization ratio 322 can decrease the pole-zero distance and therefore decrease the bandwidth of the acoustic filter 124. At the low-order mode 706, a bandwidth of the frequency response 1104 is narrower than the bandwidth of the frequency response 1102. It can also be seen that spurious-mode suppression is dependent on the metallization ratio 322. The frequency response 1104 has better spurious-mode suppression compared to the frequency response 1102, for instance. Additionally, increasing the metallization ratio 322 can increase the static capacity of the acoustic filter 124. As such, the acoustic filter 124 with the frequency response 1104 can have a smaller footprint compared to the acoustic filter 124 with the frequency response 1102. In terms of insertion loss, increasing the metallization ratio 322 increases the insertion loss at the low-order mode 706. For example, the acoustic filter 124 with the frequency response 1104 experiences more insertion loss compared to the acoustic filter 124 with the frequency response 1102.

For the high-quality temperature-compensated surface-acoustic-wave filter 136, the embedded electrode structure 128 improves the pole-zero distance compared to another high-quality temperature-compensated surface-acoustic-wave filter with a non-embedded electrode structure. This enables a thickness of the compensation layer 304 to be increased, which improves the temperature coefficient of frequency.

Some high-quality temperature-compensated surface-acoustic-wave filters can be sensitive to the spurious mode 1108 (e.g., a plate mode). The geometric properties 130 of the embedded electrode structure 128, however, can be tailored to suppress the spurious mode. For example, the metallization ratio 322 can be increased to enhance spurious-mode suppression, as shown in FIG. 11. Although the thickness of the compensation layer 304 can be reduced to improve the spurious-mode suppression, this can decrease the pole-zero distance and thus the bandwidth of the high-quality temperature-compensated surface-acoustic-wave filter. The embedded electrode structure 128 can increase the pole-zero distance by a sufficient amount to compensate for this decrease. More specifically, the embedded electrode structure 128 provides additional margin to the pole-zero distance such that the high-quality temperature-compensated surface-acoustic-wave filter 136 can be designed to fit within a given size constraint, realize a particular temperature stability, and provide sufficient spurious-mode suppression.

FIG. 12 is a flow diagram illustrating an example process 1200 for manufacturing an acoustic filter 124 with an embedded electrode structure 128. The process 1200 is described in the form of a set of blocks 1202-1204 that specify operations that can be performed. However, operations are not necessarily limited to the order shown in FIG. 12 or described herein, for the operations may be implemented in alternative orders or in fully or partially overlapping manners. Also, more, fewer, and/or different operations may be implemented to perform the process 1200, or an alternative process. Operations represented by the illustrated blocks of the process 1200 may be performed to manufacture the acoustic filter 124 (e.g., of FIGS. 1, 3-1, 4-1, 4-2, and 4-3). More specifically, the operations of the process 1200 may be performed, at least in part, to provide an embedded electrode structure 128 with particular geometric properties 130 (e.g., of FIGS. 6 to 11) to optimize performance of the acoustic filter 124.

At 1202, a piezoelectric layer having two opposite surface that respectively form a first plane and a second plane is provided. For example, a manufacturing process provides the piezoelectric layer 126. The piezoelectric layer 126 has two opposite surfaces 502-1 and 502-2, which respectively form first and second planes 504-1 and 504-2, as shown in FIG. 5-1.

At 1204, an electrode structure that is at least partially embedded within the piezoelectric layer is provided. The electrode structure comprises multiple fingers positioned across a first axis. For example, the manufacturing process provides the electrode structure 128, which is at least partially embedded within the piezoelectric layer 126, as shown in FIGS. 4-1 to 5-2. The electrode structure 128 includes multiple fingers 320, which are positioned across the first axis 410 as shown in FIGS. 4-1 to 5-1.

A value of a metallization ratio associated with the multiple fingers is greater than approximately 0.2. For example, the metallization ratio 322 associated with the multiple fingers 320 is greater than approximately 0.2. To implement an example surface-acoustic-wave filter 132 or an example thin-film surface-acoustic-wave filter 134, the value of the metallization ratio further has a range approximately from 0.3 and 0.6. The metallization ratio 322 can be approximately equal to 0.4, 0.5, or 0.6, for instance. To implement an example high-quality temperature-compensated surface-acoustic-wave filer 136, the value of the metallization ratio 322 further has a range that is greater than approximately from 0.2. For example, the metallization ratio 322 can be approximately equal to 0.2, 0.3, 0.4, 0.5, 0.6, 0.7, 0.8, and so forth.

A cross section of each finger of the multiple fingers has a planar surface that is perpendicular to the first plane, the cross section having a first segment that abuts the first plane and a second segment that is between the first plane and the second plane. A tangent line positioned at a point along an edge of the cross section forms an exterior angle relative to the first axis. A value of the exterior angle has a range approximately from 50° to 120°. The edge of the cross section joins the first segment to the second segment.

For example, a cross section 508 of each finger 320 of the multiple fingers 320 has a planar surface that is perpendicular to the first plane. The planar surface of the cross section 508 can also be parallel with the first axis 410. The cross section 508 has a first segment 512-1 that abuts the first plane 504-1 and a second segment 512-2 that is between the first plane 504-1 and the second plane 504-2, as shown in FIG. 5-1. A tangent line 520 is positioned at a point along an edge of the cross section 508 (e.g., along the sidewall 514) and forms an exterior angle 324 relative to the first axis 410, as shown in FIGS. 5-1 and 5-2. The edge of the cross section 508 joins the first segment 512-1 to the second segment 512-2, as shown in FIG. 5-1.

A value of the exterior angle 324 has a range approximately from 50° to 120°. To implement an example surface-acoustic-wave filter 132, an example thin-film surface-acoustic-wave filter 134, or an example high-quality temperature-compensated surface-acoustic-wave filter 136, the value of the angle 324 further has a range approximately from 60° to 90°. The angle 324 can be approximately equal to 70°, 80°, or 90°, for instance.

The following paragraphs describe some aspects of example implementations and/or example configurations related to the apparatuses and/or processes presented above.

Example Aspect 1: An apparatus comprising:

an acoustic filter comprising:

- a piezoelectric layer having two opposite surfaces that respectively form a first plane and a second plane;
- an electrode structure that is at least partially embedded within the piezoelectric layer, the electrode structure comprising multiple fingers positioned across a first axis, a value of a metallization ratio associated with the multiple fingers being greater than approximately 0.2;

a cross section of each finger of the multiple fingers having a planar surface that is perpendicular to the first plane, the cross section having:

- a first segment that abuts the first plane; and
- a second segment that is between the first plane and the second plane; and a tangent line positioned at a point along an edge of the cross section forming an exterior angle relative to the first axis, a value of the exterior angle having a range approximately from 50° to 120°, the edge of the cross section joining the first segment to the second segment.

Example aspect 2: The apparatus of example aspect 1, wherein the electrode structure is at least partially embedded within the piezoelectric layer such that at least a portion of the electrode structure extends from the first plane towards the second plane.

Example aspect 3: The apparatus of example aspect 1 or 2, wherein the value of the exterior angle further has a range approximately from 60° to 90°.

Example aspect 4: The apparatus of any one of the previous example aspects, wherein the cross section is in a shape of a trapezoid.

Example aspect 5: The apparatus of example aspect 4, wherein:

the trapezoid comprises:

- a first base that abuts the first plane;
- a second base that faces towards the second plane; and
- a leg that joins the first base to the second base;

the point along the edge of the cross section comprises a point along the leg; and the exterior angle is formed between the leg and a line that extends past the second base along the first axis.

Example aspect 6: The apparatus of any one of the previous example aspects, wherein the metallization ratio represents an average width of adjacent fingers of the multiple fingers divided by an average distance between the adjacent fingers of the multiple fingers.

Example aspect 7: The apparatus of any one of the previous example aspects, wherein:

longitudinal axes of the multiple fingers are substantially parallel to a second axis that is perpendicular to the first axis;

a third axis is normal to the first axis and the second axis;

an orientation of the first axis, the second axis, and the third axis is relative to a crystalline structure of the piezoelectric layer as defined by Euler angles lambda ($\lambda$), mu ($\mu$), and theta ($\theta$); and a value of Euler angle mu ($\mu$) has a range approximately from −70° to −55° or at least one symmetrical equivalent.

Example aspect 8: The apparatus of example aspect 7, wherein values of the Euler angle lambda ($\lambda$) and theta ($\theta$) are approximately equal to 0°.

Example aspect 9: The apparatus of example aspect 7 or 8, wherein the piezoelectric layer comprises lithium niobate ($LiNbO_3$) material.

Example aspect 10: The apparatus of any one of example aspects 7 to 9, wherein the acoustic filter is configured to excite two modes of different orders.

Example aspect 11: The apparatus of example aspect 10, wherein one of the two modes comprises a third-order mode associated with frequencies between approximately 5 and 20 gigahertz.

Example aspect 12: The apparatus of any one of example aspects 7 to 11, wherein:

the acoustic filter is configured to excite an acoustic wave having a wavelength; and a height of each finger of the multiple fingers has a range approximately from 5% to 20% of the wavelength.

Example aspect 13: The apparatus of any one of the previous example aspects, wherein:

the acoustic filter comprises a surface-acoustic-wave filter;

the value of the exterior angle further has a range approximately from 60° to 90°; and the value of the metallization ratio further has a range approximately from 0.3 to 0.6.

Example aspect 14: The apparatus of any one of example aspects 1 to 12, wherein:

the acoustic filter comprises a thin-film surface-acoustic-wave filter;

the value of the exterior angle further has a range approximately from 60° to 90°; and the value of the metallization ratio further has a range approximately from 0.3 to 0.6.

Example aspect 15: The apparatus of any one of example aspects 1 to 12, wherein:

the acoustic filter comprises a high-quality temperature-compensated surface-acoustic-wave filter;

the value of the exterior angle further has a range approximately from 60° to 90°; and the value of the metallization ratio further has a range greater than approximately 0.2.

Example aspect 16: The apparatus of any one of the previous example aspects, wherein:

the acoustic filter comprises multiple cascaded resonators; and a resonator of the multiple cascaded resonators comprises the piezoelectric layer and the electrode structure.

Example aspect 17: The apparatus of any one of the previous example aspects, further comprising:

a wireless transceiver coupled to at least one antenna, the wireless transceiver comprising the acoustic filter and configured to filter, using the acoustic filter, a wireless signal communicated via the at least one antenna.

Example aspect 18: An apparatus comprising:

an acoustic filter configured to generate a filtered signal from a radio-frequency signal, the acoustic filter comprising:

means for producing a formed acoustic wave, the means for producing having two opposite surfaces that respectively form a first plane and a second plane; and means for converting the radio-frequency signal to an acoustic wave and converting the formed acoustic wave into the filtered signal, the means for converting at least partially embedded within the means for producing, the means for converting comprising multiple fingers positioned across a first axis, a value of a metallization ratio associated with the multiple fingers being greater than approximately 0.2;

a cross section of each finger of the multiple fingers having a planar surface that is perpendicular to the first plane, the cross section having:

a first segment that abuts the first plane; and a second segment that is between the first plane and the second plane; and a tangent line positioned at a point along an edge of the cross section forming an exterior angle relative to the first axis, a value of the exterior angle having a range approximately from 50° to 120°, the edge of the cross section joining the first segment to the second segment.

Example aspect 19: The apparatus of example aspect 18, wherein the cross section is in a shape of a trapezoid.

Example aspect 20: The apparatus of example aspect 18 or 19, wherein:

the value of the exterior angle further has a range approximately from 60° to 90°; and the acoustic filter comprises a surface-acoustic-wave filter, a thin-film surface-acoustic-wave filter, or a high-quality temperature-compensated surface-acoustic-wave filter.

Example aspect 21: The apparatus of any one of example aspects 18 to 20, wherein:

the value of the metallization ratio further has a range approximately from 0.3 and 0.6 and the acoustic filter comprises a surface-acoustic-wave filter or a thin-film surface-acoustic-wave filter; or the value of the metallization ratio further has a range greater than approximately 0.2 and the acoustic filter comprises a high-quality temperature-compensated surface-acoustic-wave filter.

Example aspect 22: A method of manufacturing an acoustic filter, the method comprising:

providing a piezoelectric layer having two opposite surfaces that respectively form a first plane and a second plane; and providing an electrode structure that is at least partially embedded within the piezoelectric layer, the electrode structure comprising multiple fingers positioned across a first axis, wherein:

a value of a metallization ratio associated with the multiple fingers is greater than approximately 0.2;

a cross section of each finger of the multiple fingers has a planar surface that is perpendicular to the first plane, the cross section having:

a first segment that abuts the first plane; and a second segment that is between the first plane and the second plane; and a tangent line positioned at a point along an edge of the cross section forms an exterior angle relative to the first axis, a value of the exterior angle having a range approximately from 50° to 120°, the edge of the cross section joining the first segment to the second segment.

Example aspect 23: The method of example aspect 22, wherein:

longitudinal axes of the multiple fingers are substantially parallel to a second axis that is perpendicular to the first axis;

a third axis is normal to the first axis and the second axis;

an orientation of the first axis, the second axis, and the third axis is relative to a crystalline structure of the piezoelectric layer as defined by Euler angles lambda (λ), mu (μ), and theta (θ); and providing the piezoelectric layer comprises providing the piezoelectric layer such that a value of Euler angle mu (μ) has a range approximately from −70° to −55° or at least one symmetrical equivalent.

Example aspect 24: The method of example aspect 23, wherein providing the piezoelectric layer comprises causing the acoustic filter to have a frequency response capable of exciting two modes of different orders.

Example aspect 25: An acoustic filter comprising:

a piezoelectric layer having two opposite surfaces that respectively form a first plane and a second plane; and an electrode structure comprising multiple fingers positioned across a first axis, at least a portion of each finger of the multiple fingers extending from the first plane towards the second plane, a value of a metallization ratio associated with the multiple fingers being greater than approximately 0.2; and a cross section of each finger of the multiple fingers having a quadrilateral shape with a segment that faces the second plane and a sidewall that forms an exterior angle with a line that extends from the segment, a value of the exterior angle having a range approximately from 50° to 120°.

Example aspect 26: The acoustic filter of example aspect 25, wherein:

the value of the exterior angle further has a range approximately from 60° to 90°; and the value of the metallization ratio further has a range approximately from 0.3 to 0.6.

Example aspect 27: The acoustic filter of example aspect 25, further comprising:

a substrate stack that abuts the second plane;

the value of the exterior angle further has a range approximately from 60° to 120°; and the value of the metallization ratio further has a range approximately from 0.3 to 0.6.

Example aspect 28: The acoustic filter of example aspect 25, further comprising:

a compensation layer disposed that abuts the first plane;

the value of the exterior angle further has a range approximately from 50° to 80°; and the value of the metallization ratio further has a range greater than approximately 0.2.

Example aspect 29: The acoustic filter of any one of example aspects 25 to 28, wherein:

longitudinal axes of the multiple fingers are substantially parallel to a second axis that is perpendicular to the first axis;

a third axis is normal to the first axis and the second axis;

an orientation of the first axis, the second axis, and the third axis is relative to a crystalline structure of the piezoelectric layer as defined by Euler angles lambda (λ), mu (μ), and theta (θ);

a value of Euler angle mu (μ) has a range approximately from −70° to −55° or at least one symmetrical equivalent;

values of the Euler angle lambda (λ) and theta (θ) are approximately equal to 0°; and the piezoelectric layer comprises lithium niobate material.

Example aspect 30: The acoustic filter of example aspect 29, wherein:

the acoustic filter is configured to excite two modes of different orders based on the values of the Euler angles lambda (λ), mu (μ), and theta (θ); and one of the two modes is associated with an order that is greater than or equal to a third order.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c). Further, items represented in the accompanying figures and terms discussed herein may be indicative of one or more items or terms, and thus reference may be made interchangeably to single or plural forms of the items and terms in this written description. Finally, although subject matter has been described in language specific to structural features or methodological operations, it is to be understood that the subject matter defined in the appended claims is not necessarily limited to the specific features or operations described above, including not necessarily being limited to the organizations in which features are arranged or the orders in which operations are performed.

What is claimed is:

1. An apparatus comprising:

an acoustic filter comprising:

a piezoelectric layer having two opposite surfaces that respectively form a first plane and a second plane;

an electrode structure that is at least partially embedded within the piezoelectric layer, the electrode structure comprising multiple fingers positioned across a first axis, a value of a metallization ratio associated with the multiple fingers being greater than approximately 0.2, wherein the metallization ratio represents an average width of adjacent fingers of the multiple fingers divided by an average distance between the adjacent fingers of the multiple fingers;

a cross section of each finger of the multiple fingers having a planar surface that is perpendicular to the first plane, the cross section having:

a first segment that abuts the first plane; and a second segment that is between the first plane and the second plane; and a tangent line positioned at a point along an edge of the cross section forming an exterior angle relative to the first axis, a value of the exterior angle having a range approximately from 50° to 120°, the edge of the cross section joining the first segment to the second segment, wherein:

longitudinal axes of the multiple fingers are substantially parallel to a second axis that is perpendicular to the first axis;

a third axis is normal to the first axis and the second axis;

an orientation of the first axis, the second axis, and the third axis is relative to a crystalline structure of the piezoelectric layer as defined by Euler angles lambda (λ), mu (μ), and theta (θ); and a value of Euler angle mu (μ) has a range approximately from −70° to −55° or at least one symmetrical equivalent.

2. The apparatus of claim 1, wherein the electrode structure is at least partially embedded within the piezoelectric layer such that at least a portion of the electrode structure extends from the first plane towards the second plane.

3. The apparatus of claim 1, wherein the value of the exterior angle further has a range approximately from 60° to 90°.

4. The apparatus of claim 1, wherein the cross section is in a shape of a trapezoid.

5. The apparatus of claim 4, wherein:

the trapezoid comprises:

a first base that abuts the first plane;

a second base that faces towards the second plane; and a leg that joins the first base to the second base;

the point along the edge of the cross section comprises a point along the leg; and the exterior angle is formed between the leg and a line that extends past the second base along the first axis.

6. The apparatus of claim 1, wherein values of the Euler angle lambda (λ) and theta (θ) are approximately equal to 0°.

7. The apparatus of claim 1, wherein the acoustic filter is configured to excite two modes of different orders based on the Euler angles lambda (λ), mu (μ), and theta (θ).

8. The apparatus of claim 1, wherein:

the acoustic filter is configured to excite an acoustic wave having a wavelength; and a height of each finger of the multiple fingers has a range approximately from 5% to 20% of the wavelength.

9. The apparatus of claim 1, wherein:

the acoustic filter comprises a surface-acoustic-wave filter;

the value of the exterior angle further has a range approximately from 60° to 90°; and the value of the metallization ratio further has a range approximately from 0.3 to 0.6.

10. The apparatus of claim 1, wherein:

the acoustic filter comprises a thin-film surface-acoustic-wave filter;

the value of the exterior angle further has a range approximately from 60° to 90°; and the value of the metallization ratio further has a range approximately from 0.3 to 0.6.

11. The apparatus of claim 1, wherein:

the acoustic filter comprises a high-quality temperature-compensated surface-acoustic-wave filter;

the value of the exterior angle further has a range approximately from 60° to 90°; and the value of the metallization ratio further has a range greater than approximately 0.2.

12. A method of manufacturing an acoustic filter, the method comprising:

providing a piezoelectric layer having two opposite surfaces that respectively form a first plane and a second plane; and providing an electrode structure that is at least partially embedded within the piezoelectric layer, the electrode structure comprising multiple fingers positioned across a first axis, wherein:

a value of a metallization ratio associated with the multiple fingers is greater than approximately 0.2, wherein the metallization ratio represents an average width of adjacent fingers of the multiple fingers divided by an average distance between the adjacent fingers of the multiple fingers;

a cross section of each finger of the multiple fingers has a planar surface that is perpendicular to the first plane, the cross section having:

a first segment that abuts the first plane; and a second segment that is between the first plane and the second plane; and a tangent line positioned at a point along an edge of the cross section forms an exterior angle relative to the first axis, a value of the exterior angle having a range approximately from 50° to 120°, the edge of the cross section joining the first segment to the second segment, wherein longitudinal axes of the multiple fingers are substantially parallel to a second axis that is perpendicular to the first axis;

a third axis is normal to the first axis and the second axis;

an orientation of the first axis, the second axis, and the third axis is relative to a crystalline structure of the piezoelectric layer as defined by Euler angles lambda (λ), mu (μ), and theta (θ); and providing the piezoelectric layer comprises providing the piezoelectric layer such that a value of Euler angle mu (μ) has a range approximately from −70° to −55° or at least one symmetrical equivalent.

13. An acoustic filter comprising:

a piezoelectric layer having two opposite surfaces that respectively form a first plane and a second plane;

an electrode structure comprising multiple fingers positioned across a first axis, at least a portion of each finger of the multiple fingers extending from the first plane towards the second plane; and a substrate stack that abuts the second plane, a value of a metallization ratio associated with the multiple fingers having a range from approximately 0.3 to 0.6, wherein the metallization ratio represents an average width of adjacent fingers of the multiple fingers divided by an average distance between the adjacent fingers of the multiple fingers; and a cross section of each finger of the multiple fingers having a quadrilateral shape with a segment that faces the second plane and a sidewall that forms an exterior angle with a line that extends from the segment, a value of the exterior angle having a range approximately from 60° to 90°.

14. The acoustic filter of claim 13, wherein:

longitudinal axes of the multiple fingers are substantially parallel to a second axis that is perpendicular to the first axis;

a third axis is normal to the first axis and the second axis;

an orientation of the first axis, the second axis, and the third axis is relative to a crystalline structure of the piezoelectric layer as defined by Euler angles lambda (λ), mu (μ), and theta (θ);

a value of Euler angle mu (μ) has a range approximately from −70° to −55° or at least one symmetrical equivalent;

values of the Euler angle lambda (λ) and theta (θ) are approximately equal to 0°; and the piezoelectric layer comprises lithium niobate material.

15. An apparatus comprising:

a high-quality temperature-compensated surface-acoustic-wave filter comprising:

a piezoelectric layer having two opposite surfaces that respectively form a first plane and a second plane;

an electrode structure that is at least partially embedded within the piezoelectric layer, the electrode structure comprising multiple fingers positioned across a first axis, a value of a metallization ratio associated with the multiple fingers being greater than approximately 0.2, wherein the metallization ratio represents an average width of adjacent fingers of the multiple fingers divided by an average distance between the adjacent fingers of the multiple fingers;

a cross section of each finger of the multiple fingers having a planar surface that is perpendicular to the first plane, the cross section having:

a first segment that abuts the first plane; and a second segment that is between the first plane and the second plane; and a tangent line positioned at a point along an edge of the cross section forming an exterior angle relative to the first axis, a value of the exterior angle having a range approximately from 60° to 90°, the edge of the cross section joining the first segment to the second segment.

* * * * *